(12) United States Patent
Kawakami et al.

(10) Patent No.: US 9,594,130 B2
(45) Date of Patent: Mar. 14, 2017

(54) MAGNETIC SENSOR DEVICE

(71) Applicant: HITACHI METALS, LTD., Tokyo (JP)

(72) Inventors: Makoto Kawakami, Osaka (JP); Yasunori Takaki, Osaka (JP)

(73) Assignee: HITACHI METALS, LTD., Tokyo (JP)

( * ) Notice: Subject to any disclaimer, the term of this patent is extended or adjusted under 35 U.S.C. 154(b) by 72 days.

(21) Appl. No.: 14/394,600

(22) PCT Filed: Apr. 22, 2013

(86) PCT No.: PCT/JP2013/061811
§ 371 (c)(1),
(2) Date: Oct. 15, 2014

(87) PCT Pub. No.: WO2013/161773
PCT Pub. Date: Oct. 31, 2013

(65) Prior Publication Data
US 2015/0097560 A1 Apr. 9, 2015

(30) Foreign Application Priority Data

Apr. 23, 2012 (JP) ................................. 2012-098215
Apr. 23, 2012 (JP) ................................. 2012-098216

(51) Int. Cl.
*G01R 33/02* (2006.01)
*G01R 33/09* (2006.01)
(Continued)

(52) U.S. Cl.
CPC ....... *G01R 33/091* (2013.01); *G01R 19/0092* (2013.01); *G01R 33/0076* (2013.01);
(Continued)

(58) Field of Classification Search
CPC G01R 33/091; G01R 33/093; G01R 33/0076; G01R 33/0082; G01R 33/09; G01R 19/0092
(Continued)

(56) References Cited

U.S. PATENT DOCUMENTS 4,097,802 A * 6/1978 Mazzeo ................ B82Y 25/00
324/252
5,757,183 A * 5/1998 Smith .................... G01R 33/09
324/244
(Continued)

FOREIGN PATENT DOCUMENTS

JP    A-1-170881    7/1989
JP    A-7-152008    6/1995
(Continued)

OTHER PUBLICATIONS

International Search Report issued in Application No. PCT/JP2013/061811 mailed on Jun. 11, 2013.
(Continued)

*Primary Examiner* — Jermele M Hollington
*Assistant Examiner* — Sean Curtis
(74) *Attorney, Agent, or Firm* — Oliff PLC

(57) ABSTRACT

Provided is a magnetic sensor device capable of attenuating the intensity of the magnetic field to be applied to the magnetic sensor. A magnetic sensor device includes a magnetic sensor element which detects the intensity of a magnetic field in a predetermined detection axis direction, and a magnetic field attenuation body which includes a first magnetic field attenuation unit and a second magnetic field attenuation unit, each of the attenuation units having a surface and the surfaces being opposed to each other with the magnetic sensor element therebetween.

17 Claims, 21 Drawing Sheets

(51) Int. Cl.
*G01R 33/00* (2006.01)
*G01R 19/00* (2006.01)

(52) U.S. Cl.
CPC ......... *G01R 33/0082* (2013.01); *G01R 33/02* (2013.01); *G01R 33/09* (2013.01); *G01R 33/093* (2013.01)

(58) Field of Classification Search
USPC ...... 324/207.13, 207.2, 207.21, 207.22, 219, 324/234, 260, 331, 345
See application file for complete search history.

(56) References Cited

U.S. PATENT DOCUMENTS

| | | | | |
|---|---|---|---|---|
| 7,663,358 | B2* | 2/2010 | Hashio | G01R 15/207 264/254 |
| 8,680,856 | B2* | 3/2014 | Schmitt | G01R 15/207 324/117 R |
| 9,069,032 | B2* | 6/2015 | Hebiguchi | G01R 15/205 |
| 2004/0201374 | A1* | 10/2004 | Kawase | G01R 15/185 324/117 R |
| 2004/0232912 | A1* | 11/2004 | Tsukamoto | G01R 33/0358 324/248 |
| 2005/0030018 | A1* | 2/2005 | Shibahara | G01R 15/20 324/251 |
| 2008/0186021 | A1* | 8/2008 | Hashio | G01R 15/207 324/225 |
| 2010/0301835 | A1* | 12/2010 | Kasajima | G01R 15/207 324/117 R |
| 2011/0317313 | A1* | 12/2011 | Miyauchi | B82Y 10/00 360/245.3 |
| 2012/0062224 | A1* | 3/2012 | Ide | B82Y 25/00 324/252 |
| 2012/0293170 | A1* | 11/2012 | Nakajima | B82Y 25/00 324/252 |
| 2013/0057273 | A1* | 3/2013 | Ide | G01R 33/093 324/252 |
| 2013/0127456 | A1* | 5/2013 | Hebiguchi | G01R 15/205 324/252 |
| 2015/0048819 | A1* | 2/2015 | Kawakami | G01R 33/09 324/249 |
| 2015/0097560 | A1* | 4/2015 | Kawakami | G01R 33/09 324/252 |

FOREIGN PATENT DOCUMENTS

| | | |
|---|---|---|
| JP | A-10-104327 | 4/1998 |
| JP | A-11-19064 | 1/1999 |
| JP | A-2008-151743 | 7/2008 |
| JP | A-2009-036579 | 2/2009 |
| JP | 2009222542 A * | 10/2009 |
| JP | A-2011-180080 | 9/2011 |
| WO | WO 2011/081197 A1 | 7/2011 |

OTHER PUBLICATIONS

International Preliminary Report on Patentability issued in International Application No. PCT/JP2013/061881 dated Oct. 28, 2014.
Mar. 4, 2016 Office Action issued in Chinese Patent Application No. 201380021435.8.

* cited by examiner (a)

(b)

(a)

(b)

(a)

(b)

MAGNETIC SENSOR DEVICE

TECHNICAL FIELD

The present disclosure relates to a magnetic sensor device which can be used as a current sensor, etc.

BACKGROUND ART

With respect to a magnetic sensor which is used for electronic devices such as mobile phones, etc., Patent Document 1 discloses a shielding technology which can reduce the influences from a magnetic field generated by an electronic part within the electronic device. In the technology disclosed in Patent Document 1, the entirety excluding the electrode unit is shielded by a shielding member, and in particular, a shielding member which is elongated in the direction detected by the magnetic sensor is used, to thereby reduce the influences from the external magnetic field through an opening of the electrode unit.

Patent Document 2 discloses a technology for enlarging a detection range under the state where no magnetic field is present, by covering an MR element with a magnetic flux absorber and increasing a magnetic flux amount necessary to reach a saturation point P.

PRIOR ARTS

Patent Document

Patent Document 1: Japanese Unexamined Patent Publication No. 2009-036579
Patent Document 2: Japanese Unexamined Patent Publication No. 2011-180080

SUMMARY

In the conventional magnetic sensor as disclosed in Patent Document 1, a magnetic field to be measured is formed within a package, and thus, the external magnetic field is shielded by shielding the entire body. However, attenuating the intensity of a magnetic field to be applied to the magnetic sensor when the applied magnetic field has a comparatively high intensity, is not disclosed. Further, in order to attenuate the intensity of the magnetic field, the magnetic sensor element is surrounded and covered by a magnetic flux absorber to enlarge the detection range under the no magnetic field state (an example in Patent Document 2).

The present disclosure has been made in view of the above drawbacks, and one of the objects of the present disclosure is to provide a magnetic sensor device capable of attenuating the intensity of the magnetic field applied to the magnetic sensor.

A magnetic sensor device according to an embodiment of the present disclosure comprises a magnetic sensor element which is formed on a substrate surface and which detects the intensity of a magnetic field in a predetermined detection axis direction, first and second surfaces parallel with the surface having the magnetic sensor element, a first magnetic field attenuation unit which is arranged in the first surface parallel with the surface of the magnetic sensor element, the first surface being a surface of a virtual cuboid having the magnetic sensor element thereinside, and a second magnetic field attenuation unit which is arranged in the second surface, the second surface being parallel with the surface of the magnetic sensor element and being a surface of the virtual rectangular parallelepiped, and which is opposed to the first magnetic field attenuation unit with the magnetic sensor element therebetween.

According to the present disclosure, the intensity of a magnetic field applied to a magnetic sensor can be attenuated.

EMBODIMENT

Figure 1:
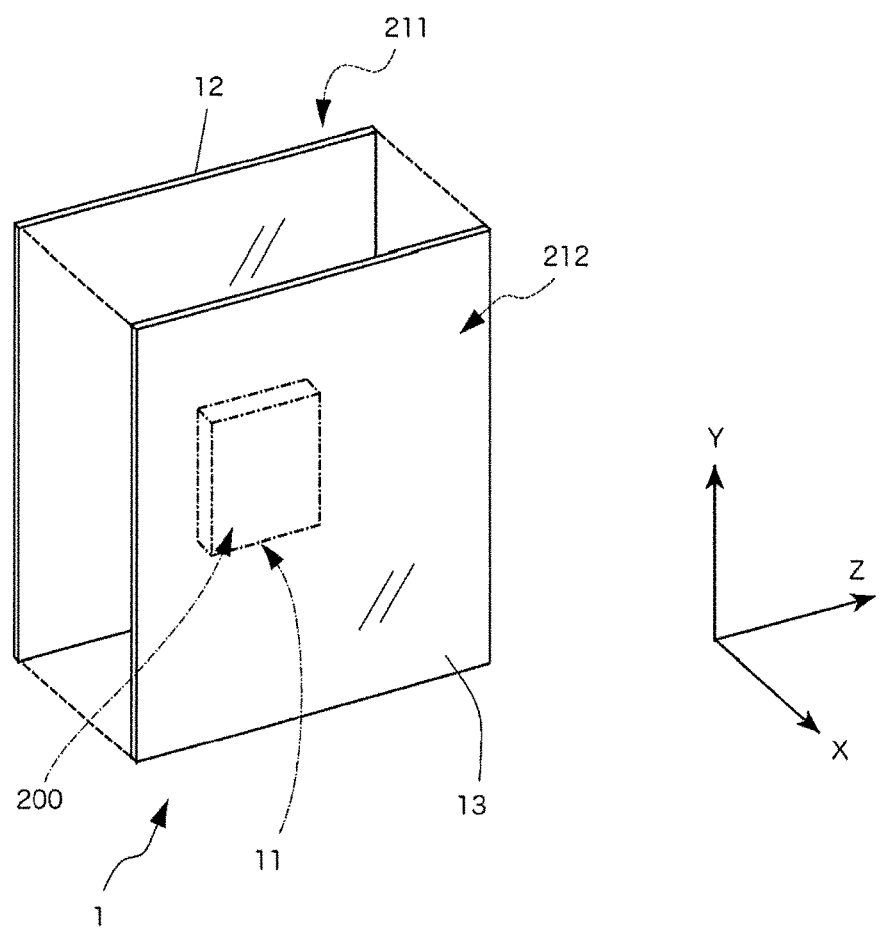
FIG. 1 is a perspective view showing the outline of an example of a magnetic sensor device according to an embodiment of the present disclosure.

The present embodiment will be explained with reference to the drawings. FIG. 1 is a perspective view showing an outline of an example of a magnetic sensor device 1 according to the present embodiment. As exemplified in FIG. 1, an example (referred to as Example A1) of a magnetic sensor device 1 according to the present embodiment comprises a magnetic sensor element 11 which is formed on a substrate surface, detects the intensity of a magnetic field in a predetermined detection axis direction (Y-axis direction), and has a substantially cuboidal shape. The magnetic sensor device 1 further comprises a first magnetic field attenuation unit 12 and a second magnetic field attenuation unit 13. First and second surfaces 211 and 212 are virtually provided to be in parallel with a surface (a surface with its normal line extending toward the positive direction of the X-axis) 200 (or the rear surface thereof (a surface with its normal line extending toward the negative direction of the X-axis) of the magnetic sensor element 11. The first magnetic field attenuation unit 12 is arranged in the first surface 211 and hide the magnetic sensor element 11 in the plan view (from the viewpoint viewed from the positive direction to the negative direction of the X-axis). The second magnetic field attenuation unit 13 is arranged in the second surface 212 and is opposed to the first magnetic with the field attenuation unit 12 with the magnetic sensor element 11 therebetween (the magnetic sensor element being between the first and second magnetic attenuation units 12 and 13).

In practice, the entirety of the magnetic sensor device 1 including the magnetic sensor element 11 and the first and second magnetic field attenuation units 12 and 13 is molded with a resin, etc., which has a lower magnetic permeability than the first and second magnetic field attenuation units 12 and 13. However, for easy explanation, the resin is omitted from the drawings, and the first and second magnetic field attenuation units 12 and 13 are shown as transmission images.

By arranging the magnetic field attenuation units in parallel with the surface (the detection axis direction is included in the plane of the surface) of the magnetic sensor element 11, the magnetic flux passing through the magnetic sensor element 11 also passes through the magnetic field attenuation units which have a comparatively high magnetic permeability. Thereby, the intensity of a magnetic field to be applied to the magnetic sensor element 11 can be attenuated. As far as the magnetic field attenuation units are arranged to be parallel with the above-mentioned surface of the magnetic sensor element 11, the shape of the magnetic field attenuation unit is not limited to the shape described above. Namely, the shape of the second magnetic field attenuation unit 13 is not limited to the shape shown in Example A1 exemplified in FIG. 1. In FIG. 1, other magnetic field attenuation units may be arranged in planes 213 and 214 which have normal lines in the Z-axis direction (in the direction perpendicular to the detection axis direction) and are opposed to each other. In addition, no magnetic field attenuation units may be arranged in planes 215 and 216 which have normal lines in the Y-axis direction (the detection axis direction) and are opposed to each other.

As exemplified in FIG. 2(a) and FIG. 2(b), a magnetic sensor device 1 according an example (Example A2) of the present embodiment comprises a plate-like magnetic sensor element 11 which is formed on a substrate surface and detects the intensity of a magnetic field in a predetermined detection axis direction, a first magnetic field attenuation unit 12 which has a surface in parallel with a surface of the magnetic sensor element 11 and has a depth and a width capable of hiding the magnetic sensor element 11 therein in the plan view, and a pair of second magnetic field attenuation units 13a and 13b which are opposed to the first magnetic field attenuation unit 12 with the magnetic sensor element 11 therebetween and, are arranged in a virtual plane parallel with the surface of the magnetic sensor element 11 and at opposite ends in the direction perpendicular to the detection axis direction with the magnetic sensor element 11 therebetween in the plan view. FIG. 2(a) is a perspective view showing the outline of the magnetic sensor device 1 according to the present disclosure. FIG. 2(b) is a plan view showing the outline of the magnetic sensor device 1 according to the present embodiment.

In this example, as shown in FIG. 2(a), in the plan view, the first magnetic field attenuation unit 12 has a rectangular plate shape with the depth (Y-axis direction) of 2000 μm and a width (Z-axis direction) of 1000 μm, and thus, has a depth and a width capable of hiding the magnetic sensor element 11. More preferably, the center (intersection of diagonal lines) of the first magnetic field attenuation unit 12 matches the center (intersection of diagonal lines) of a virtual rectangle circumscribing the magnetic sensor element 11. Namely, the magnetic sensor element 11 is arranged at the center of the magnetic field attenuation unit 12 in the plan view. With this respect, Example A1 may have the same arrangement. By matching the centers, the largest attenuation effect can be obtained with the smallest amount of members.

In Example A2, each of the second magnetic field attenuation units 13a and 13b has a rectangular shape having a depth (Y-axis direction) of 2000 μm and a width (Z-axis direction) of about 250 μm. The second magnetic field attenuation units 13a and 13b are arranged so that the positions of the second magnetic field attenuation units 13a and 13b in the depth direction (Y-axis direction) are respectively aligned with the positions of the first magnetic field attenuation unit 12 in the depth direction, in the plan view. Further, the upper edge (the upper side in the figure) in the Z-axis direction of first magnetic field attenuation unit 12 is aligned with the upper edge (upper side in the figure) in the Z-axis direction of the second magnetic field attenuation unit 13a, in the plan view. In addition, the lower edge (the lower side in the figure) in the Z-axis direction of first magnetic field attenuation unit 12 is aligned with the lower edge (lower side in the figure) in the Z-axis direction of the second magnetic field attenuation unit 13b, in the plan view. Namely, the pair of second magnetic field attenuation units 13a and 13b are arranged on the inside of the width of the first magnetic field attenuation unit 12.

Figure 3:
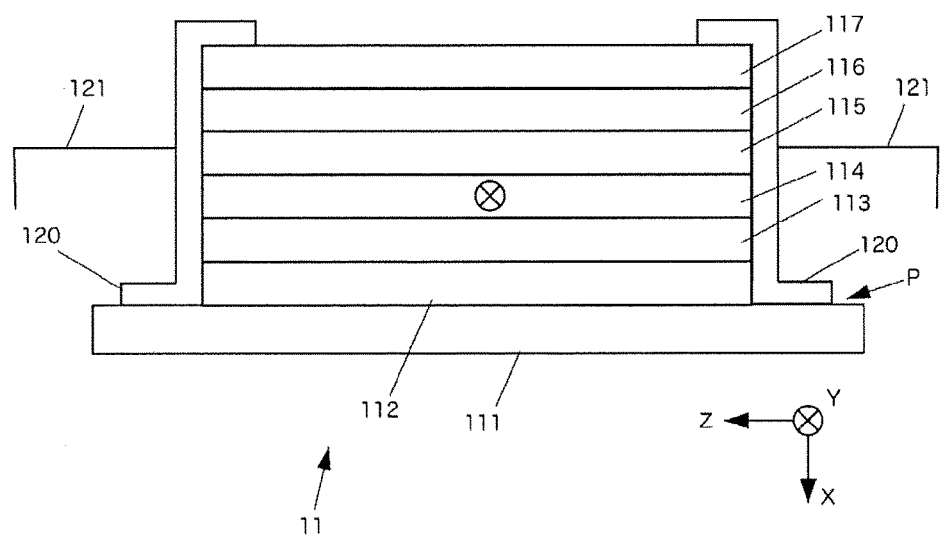
FIG. 3 is an explanatory view showing an example of a magnetic sensor element of a magnetic sensor device according to an embodiment of the present disclosure.

In these Examples A1 and A2, the magnetic sensor element 11 detects the intensity of a magnetic field in a predetermined detection axis direction. The magnetic sensor element 11 is, for example, a SVGMR element (Spin Valve Giant magnetoresistive element) as exemplified in FIG. 3, which is a plate-like magnetic sensor element comprising a SVGMR element film formed by sputtering a ground layer 112, an antiferromagnetic layer 113, a fixed layer 114, a nonmagnetic conductive layer 115, a free layer 116, and a protection layer 117 in this order (in the X-axis direction) on the surface P (hereinbelow, this surface is located on the YZ-plane for the purpose of easy explanation, and the surface being parallel with the surface 200 of the magnetic sensor element 11) of the substrate 111. In this magnetic sensor element 11, i.e., the SVGMR element, the magnetization direction of the free layer 116 rotates in response to the externally applied magnetic field. The electrical resistance of the nonmagnetic conductive layer 115 is changed depending on the relative angle between the magnetization direction of the free layer 116 and the magnetization direction of the fixed layer 114.

Namely, in this magnetic sensor element 11, the size of a magnetic field to be applied to the magnetic sensor element is changed due to the rotation of the magnetic field in the in-plane direction within the plane of the fixed layer 114 or the free layer 116 (the plane parallel with the surface P of the substrate 111), or the size of a magnetic field is changed in parallel or antiparallel direction within the in-plane direction and, and thereby, the magnetization direction of the free layer 116 is rotated or reversely rotated, and thus, the magnetic field can be detected. Namely, the detection axis direction of the magnetic sensor element 11 according to the present example is located within the plane of the fixed layer 114 or the free layer 116. Therefore, the detection axis is in the YZ-plane, and is the Y-axis direction in this example.

The magnetic sensor element 11 is connected, at the opposite ends thereof, to conductors 120, and the conductors are connected to leads 121.

The first magnetic field attenuation unit 12 and the second magnetic field attenuation units 13a and 13b may be configured using, for example, following materials.

(1) Fe—Ni based alloy material (permalloy, 42 Alloy, 45 Alloy, etc.)
(2) Nanocrystal soft magnetic material formed by using an alloy material which is obtained by adding Cu, Nb, Ta, Mo, Zr, etc., to the basic constituent of Fe—B or Fe—Si—B
(3) Amorphous magnetic material of a Fe group, a Co group, or the like.
(4) Silicon steel plate, etc.

In any of the cases, forming with a magnetic material having a high magnetic permeability is preferable. For example, the attenuation unit may be formed by rolling a Fe—Ni based alloy material to have a frame shape, may be formed by plating deposition of a soft magnetic film, or may be formed with a soft ferrite substrate or a soft ferrite sheet. The attenuation unit may also be formed by molding a powder, or by resin impregnation. Further, the substrate of the magnetic sensor element may be used as a part of the attenuation unit by using a ferrite substrate, etc., instead of the Si substrate.

Figure 2:
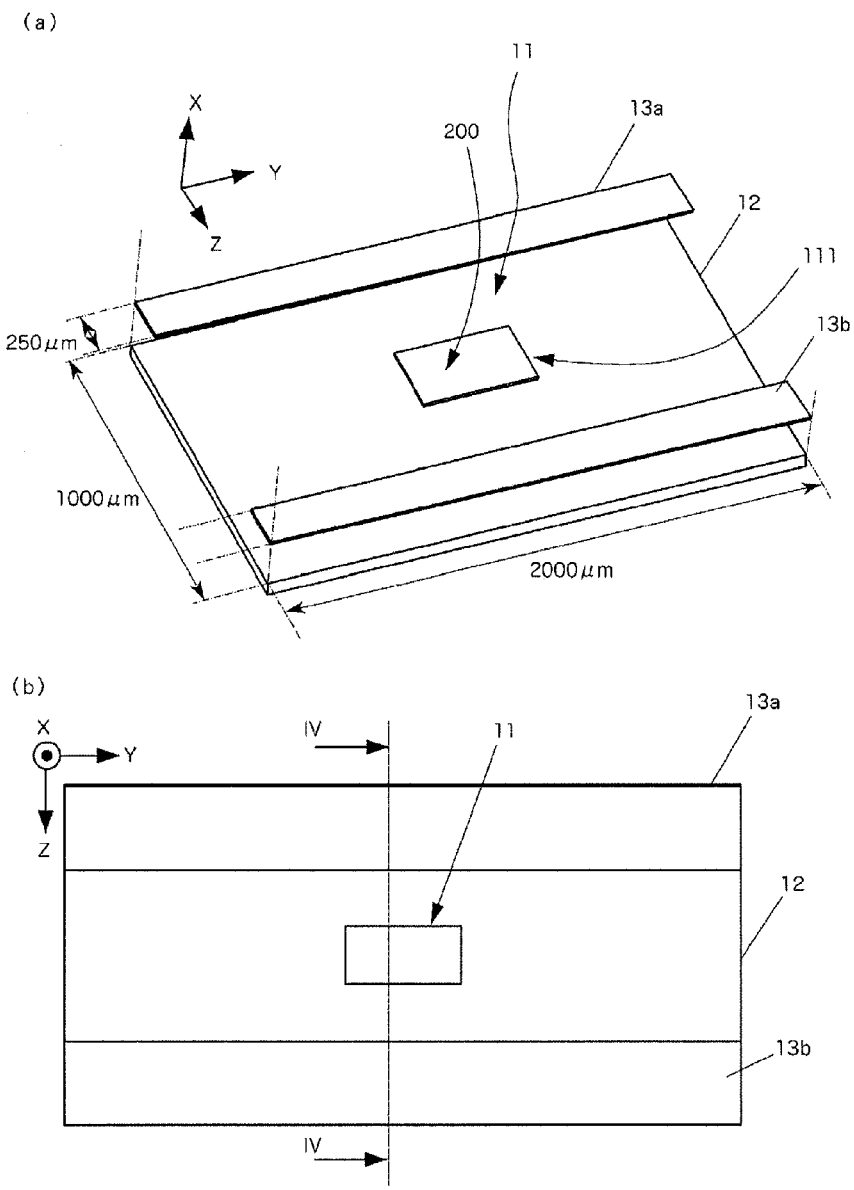
FIG. 2 is a perspective view showing the outline of another example of a magnetic sensor device according to an embodiment of the present disclosure.

In Example A2 of the present embodiment shown in FIG. 2, the first magnetic field attenuation unit 12 has a surface parallel with the surface 200 (the surface parallel with the surface P of the substrate 111: the YZ-plane in the figure) of the magnetic sensor element 11 as shown in FIG. 1. The second magnetic field attenuation units 13a and 13b, each having a plate-like shape, are arranged in a virtual plane which is opposed to the first magnetic field attenuation unit 12 with the magnetic sensor element 11 therebetween. According an example of the present embodiment, each of the pair of second magnetic field attenuation units 13a and 13b has a rectangular surface with its longitudinal direction in the detection axis direction (Y-axis direction) of the magnetic sensor element 11.

Figure 4:
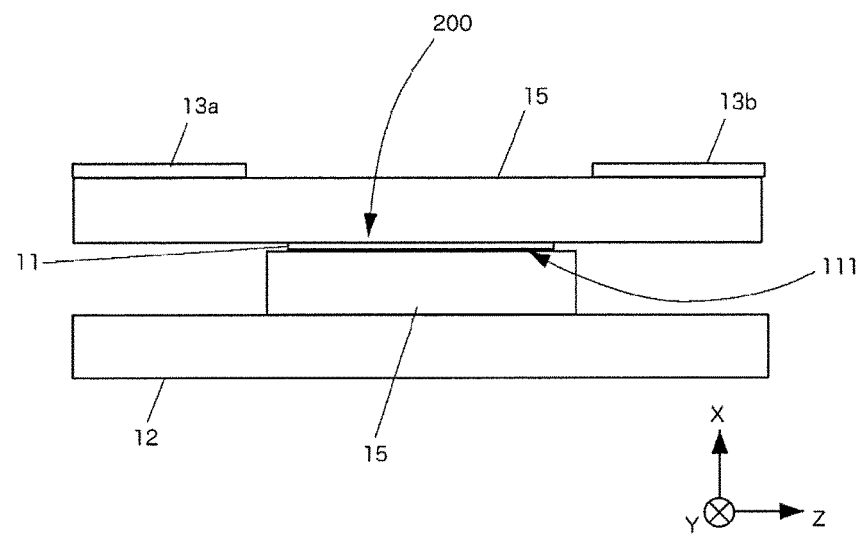
FIG. 4 is a cross-sectional view showing an outline of an example of a magnetic sensor device according to an embodiment of the present disclosure.

FIG. 4 is a cross-sectional view showing a cross section of a magnetic field attenuation body according to Example A2 cut along the XZ-plane to include the magnetic sensor element 11 (cross-section along the line IV-IV in FIG. 2). As explained below, in these Examples A1 and A2, the entirety of the magnetic sensor element 11 and the first and second magnetic field attenuation units 12 and 13 (hereinbelow, collectively referred to as an attenuation body) are, for example, resin molded (in FIG. 4 also shows the state where the resin is removed, for easy explanation)

In the example shown in FIG. 4, spacers 15 are respectively arranged between the magnetic sensor element 11 and the first magnetic field attenuation unit 12 as well as between the magnetic sensor element 11 and the second magnetic field attenuation unit 13. The spacer 15 is made of a material having a lower magnetic permeability than the first and second magnetic field attenuation units 12 and 13, and is arranged to be in contact with the sensor element. The portions through which leads are to be introduced, are formed by a nonconductor so as to prevent short-circuits. Specifically, the spacer 15 may be formed by a Si substrate, or a material having a thermal expansion coefficient, the difference of which from the thermal expansion coefficient of the resin mold is within a predetermined range. Further, no spacer 15 may be used between the substrate 111 side magnetic field attenuation units 13a, 13b and the magnetic sensor element 11, while, instead of the spacer 15, the thickness of the substrate 111 is made thicker by the thickness corresponding to the thickness of the spacer 15. At least a part of the resin, the substrate 111, or the spacer 15, may be projected to the external side of the outer edge of the magnetic field attenuation unit 12 in the plan view, or projected to the external side of the outer edge of the pair of magnetic field attenuation units 13a and 13b. Since they are non-magnetic members, they do not have any influences on the property relating to attenuation.

Figure 5:
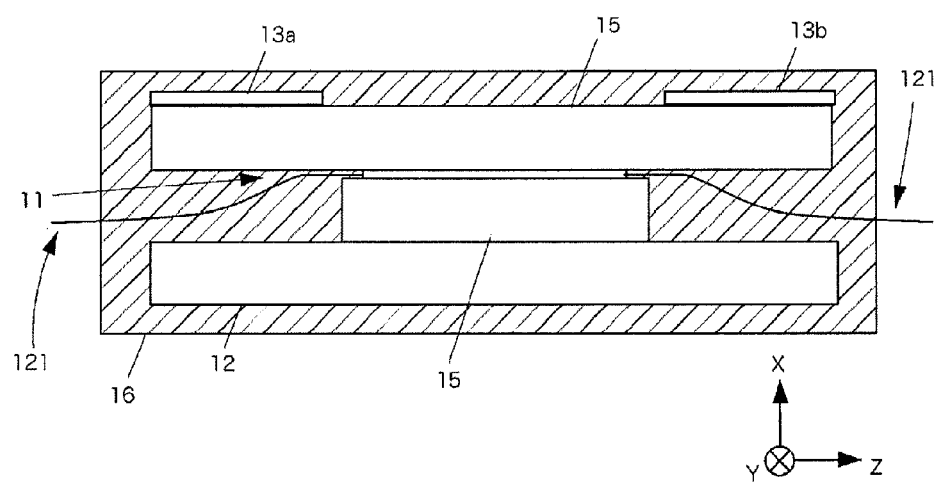
FIG. 5 is a cross-sectional view showing an outline of another example of a magnetic sensor device according to an embodiment of the present disclosure.

In addition, in the magnetic sensor device 1 according to this example, the entirety of these members may be molded with a resin 16 (FIG. 5). FIG. 5 is a schematic cross-sectional view of the resin molded magnetic sensor device 1, showing the same broken-out surface as FIG. 4. The lead 121 connected to the magnetic sensor element 11 is introduced to the outside of the resin mold.

Figure 6:
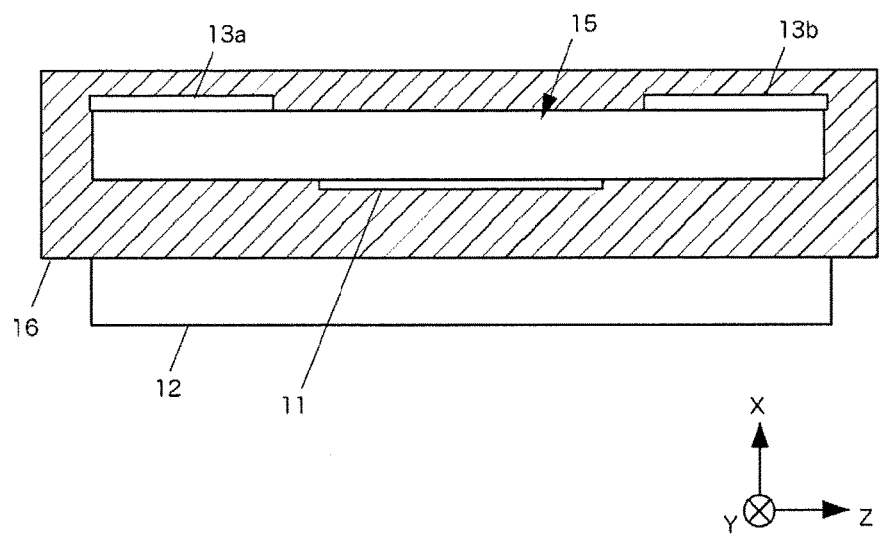
FIG. 6 is a cross-sectional view showing an outline of still another example of a magnetic sensor device according to an embodiment of the present disclosure.
Figure 6:
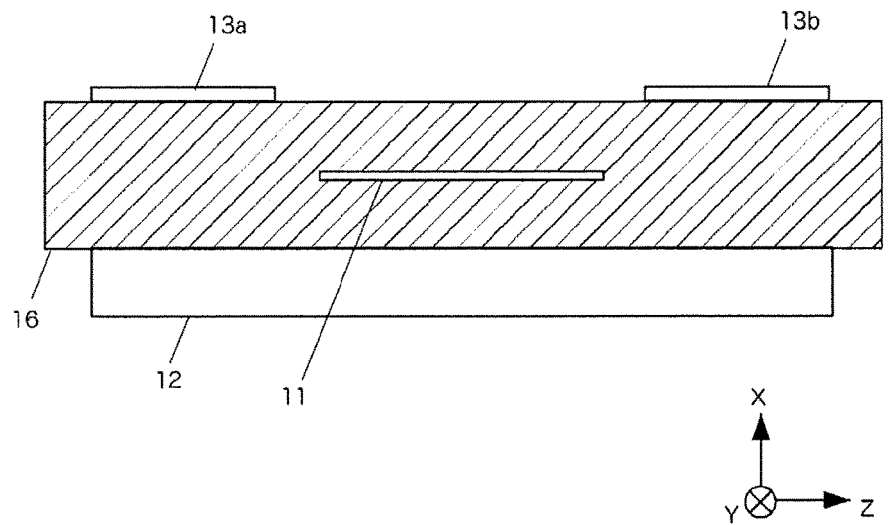

Further, unlike the example shown in FIG. 5 in which the entirety is molded with the resin 16, as exemplified in FIG. 6(*a*), the magnetic sensor element 11 and the second magnetic field attenuation units 13*a* and 13*b* may be molded with the resin 16, and the first magnetic field attenuation unit 12 may be arranged on the outside of the mold, at the position opposing to the second magnetic field attenuation units 13*a* and 13*b* with the magnetic sensor element 11 therebetween.

As exemplified in FIG. 6(*b*), only the magnetic sensor element 11 may be molded with the resin 16, and the first magnetic field attenuation unit 12 and the second magnetic field attenuation units 13*a* and 13*b* may be arranged at predetermined positions on the outside of the mold. In these examples, where the resin 16 functions as the spacer 15, the spacer 15 is not always necessary. In Example A1, similar to Example A2, the spacers 15 may be arranged between the magnetic sensor element 11 and the first and second magnetic field attenuation units 12 and 13, respectively. Alternatively, no spacer 15 may be used between the substrate 111 side magnetic field attenuation unit 13 and the magnetic sensor element 11, and instead, the thickness of the substrate 111 may be made thicker by the thickness corresponding to the thickness of the spacer 15.

Figure 7:
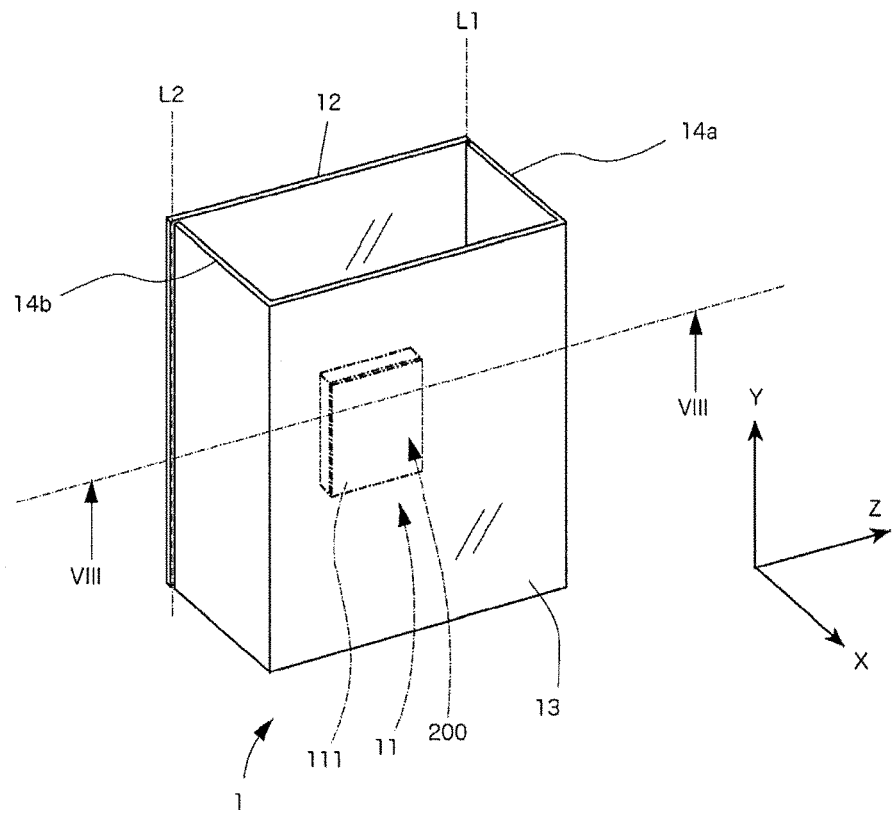
FIG. 7 is a perspective view showing an outline of still another example of a magnetic sensor device according to an embodiment of the present disclosure.

As exemplified in FIG. 7, another example (Example B) of the magnetic sensor device 1 according to the present embodiment comprises a magnetic sensor element 11, a first magnetic field attenuation unit 12 and a second magnetic field attenuation unit 13, surfaces of these attenuation units being opposed to each other with the magnetic sensor element 11 therebetween, and third magnetic field attenuation units 14*a* and 14*b* which are provided in the direction intersecting the first and second magnetic field attenuation units.

Here, the magnetic sensor element 11 detects the intensity of a magnetic field in a predetermined detection axis direction. The magnetic sensor element 11 may be the same as the SVGMR element (Spin Valve Giant magnetoresistive element) exemplified in FIG. 2. The detection axis direction is also the Y-axis direction. In addition, the detection axis direction may be the Z-axis direction. In this case, not only the attenuation effect may be obtained, but also the influence from the external disturbance magnetic field may be reduced, leading to the higher precision measurement.

The first magnetic field attenuation unit 12, the second magnetic field attenuation unit 13, and the third magnetic field attenuation units 14*a* and 14*b* may be configured using, for example, following materials.

(1) Fe—Ni based alloy material (permalloy, 42 Alloy, 45 Alloy, etc.)
(2) Nanocrystal soft magnetic material formed by using an alloy material obtained by adding Cu, Nb, Ta, Mo, Zr, etc., to the basic constituent of Fe—B or Fe—Si—B
(3) Amorphous magnetic material a Fe group, a Co group, or the like.
(4) Silicon steel plate, etc.

In any of the cases, forming with a magnetic material having a high magnetic permeability is preferable. For example, the attenuation unit may be formed by rolling a Fe—Ni based alloy material to have a frame shape, may be formed by plating deposition of a soft magnetic film, or may be formed with a soft ferrite substrate or a soft ferrite sheet. The attenuation unit may also be formed by molding a powder, or by resin impregnation. Further, the substrate of the magnetic sensor element may be used as a part of the attenuation unit by using a ferrite substrate, etc., instead of the Si substrate.

According to an example (referred to as Example B1) of the present embodiment, provided is a magnetic field attenuation body including a first magnetic field attenuation unit 12, a second magnetic field attenuation unit 13, and third magnetic field attenuation units 14*a* and 14*b*, the first and second magnetic field attenuation units 12 and 13 respectively having surfaces opposing to each other with the magnetic sensor element 11 therebetween, and the third magnetic field attenuation units 14*a* and 14*b* respectively having surfaces opposing to each other with the magnetic sensor element 11 therebetween and being arranged in the direction parallel to the detection axis of the magnetic sensor element 11 and intersecting the first and second magnetic field attenuation units 12 and 13. As shown in FIG. 7, the first magnetic field attenuation unit 12 has a surface parallel with the surface 200 (surface parallel with the surface P of the substrate 111: YZ-plane in the figure) of the magnetic sensor element 11. The second magnetic field attenuation unit 13 is opposed to the first magnetic field attenuation unit 12 with the magnetic sensor element 11 therebetween, and has a surface parallel with the surface 200 (surface parallel with the surface P of the substrate 111: YZ-plane in the figure) of the magnetic sensor element 11. Further, the third magnetic field attenuation units 14*a* and 14*b* respectively have surfaces opposing to each other with the magnetic sensor element 11 therebetween and are arranged in the direction parallel with the detection axis of the magnetic sensor element 11 and intersecting the first and second magnetic field attenuation units 12 and 13. In the example shown in FIG. 7, all of the first magnetic field attenuation unit 12, the second magnetic field attenuation unit 13, and the third magnetic field attenuation units 14*a* and 14*b* have substantially the same length in the Y-axis direction, and are arranged by aligning the positions in the Y-axis direction. In Example B1, a low magnetic permeability portion such as a resin, spacer, hole, etc., which has a lower magnetic permeability than the first and second magnetic field attenuation units 12 and 13, is formed in the detection axis direction of the magnetic sensor element 11.

Figure 8:
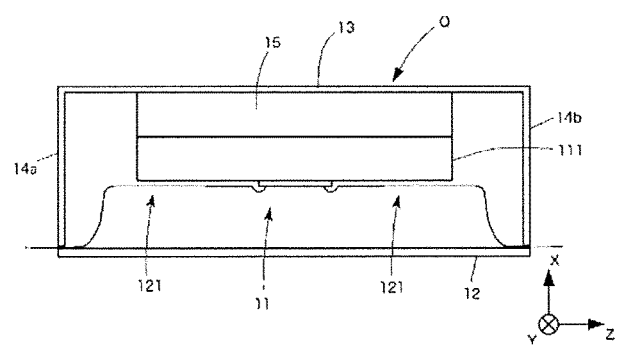
FIG. 8 is a cross-sectional view showing still another example of a magnetic sensor device according to an embodiment of the present disclosure.

In Example of B1 of the present embodiment, the second magnetic field attenuation unit 13 and the third magnetic field attenuation unit 14 are connected to each other. Namely, the second magnetic field attenuation unit 13 and the third magnetic field attenuation unit 14 integrally form a substantially Π shaped magnetic field attenuation body. The third magnetic field attenuation unit 14 does not have to perpendicularly intersect the surface Q of the second magnetic field attenuation unit 13, but may obliquely intersect the surface Q of the second magnetic field attenuation unit 13. FIG. 7 is a perspective view of the magnetic field attenuation body according the present example. FIG. 8 is a cross-sectional view showing the cross-section of the magnetic field attenuation body according to the present example, cut along the XZ-plane to include the magnetic sensor element 11 (cross-section along the line VIII-VIII in FIG. 7). As mentioned below, in Example B1, the entirety of the magnetic sensor element 11 and the magnetic field attenuation body are resin molded, but in FIG. 7 and FIG. 8, the resin mold is not shown for explanation purposes.

As exemplified in FIG. 7, in Example B1 of the present embodiment, a substantially tube-shaped magnetic field attenuation body is formed by the first magnetic field attenuation unit 12, the second magnetic field attenuation unit 13, and the third magnetic field attenuation units 14a and 14b. No magnetic field attenuation unit is placed in the detection axis direction (Y-axis direction), and instead, an opening is formed as a low magnetic permeability portion which has a lower magnetic permeability (giving as little influence as possible to the magnetic field measurement result) than the magnetic field attenuation unit. The lead 121 extending from the magnetic sensor element 11 is introduced to the outside through the portion between the first magnetic field attenuation unit 12 and the Π shaped magnetic field attenuation body, i.e., the integral body of the second magnetic field attenuation unit 13 and the third magnetic field attenuation unit 14 (FIG. 8). Further, in the example of FIG. 8, a spacer 15 is arranged between the magnetic sensor element 11 and the Π shaped magnetic field attenuation body, i.e., the integral body of the second magnetic field attenuation unit 13 and the third magnetic field attenuation unit 14. The spacer 15 is formed by a nonconductor, and may be formed by, for example, a Si substrate or a material having a thermal expansion coefficient, the difference of which from the thermal expansion coefficient of the resin mold is within a predetermined range. The spacer 15 may not be provided, and instead of the spacer 15, the thickness of the substrate 111 may be made thicker by the thickness corresponding to the thickness of the spacer 15. In Example B1 of the present embodiment, the magnetic field attenuation unit has a substantially tube shape, but the outer periphery thereof may be discontinuous or may be provided with slits. In this case, the magnetic field attenuation unit does not provide complete shielding, and thus, the detection axis direction may be set in the Z-axis direction. With this structure, the wire can be introduced from the opening, and the influence from the external disturbance magnetic field can be reduced, leading to the more accurate measurement.

In addition, in the magnetic sensor device 1 according to the present example, the entirety of the above described members may be molded with resin. The lead 121 connected to the magnetic sensor element 11 is introduced to the outside of the resin mold.

In Example B1, the width of the first magnetic field attenuation unit 12 in the Z-axis direction is made wider than the width of the second magnetic field attenuation unit 13 in the Z-axis direction, in order that virtual lines L1 and L2 (the lines extending in the Y-axis direction in FIG. 7) at which a virtual plane including the third magnetic field attenuation unit 14 intersects a virtual plane including the first magnetic field attenuation unit 12, are located on the first magnetic field attenuation unit 12.

Also, the lead 121 may be introduced to the outside through the opening formed in the Y-axis direction, and the first magnetic field attenuation unit 12 may be integrally formed with the second and third magnetic field attenuation units 13 and 14. In this case, the magnetic field attenuation body forms a hollow quadrangular pillar.

Figure 9:
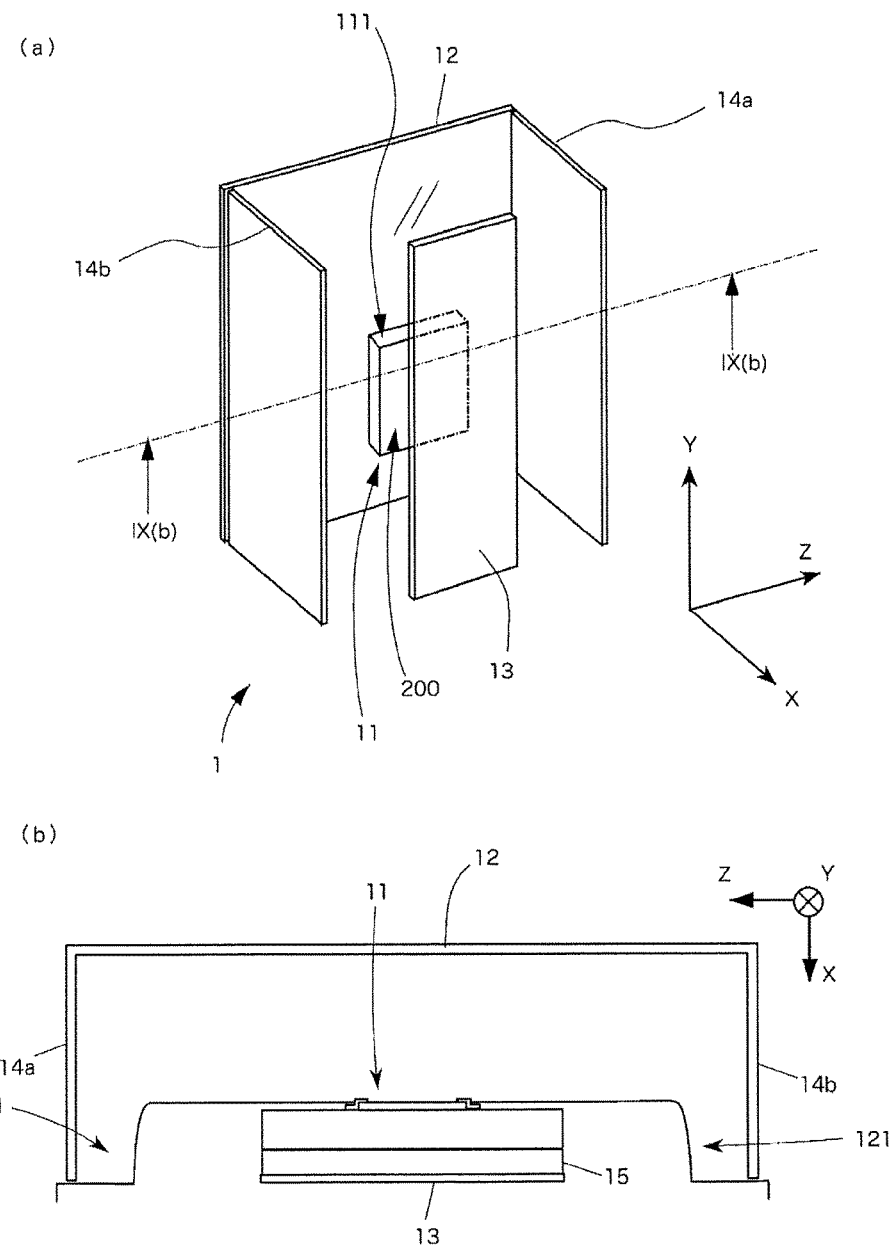
FIG. 9 is an explanatory view showing an outline of still another example of a magnetic sensor device according to an embodiment of the present disclosure.

The present embodiment is not limited to these examples. FIG. 9(a) and FIG. 9(b) are a perspective view and a cross-sectional view along IX(b)-IX(b) showing the outline of a magnetic sensor device according to Example B2, still another example of the present embodiment. Example B2 has basically the same structure as Example B1, but the shape of the magnetic field attenuation body is different. As exemplified in FIG. 9, in the magnetic field attenuation body according to the present example, the length of the first magnetic field attenuation unit 12 in the direction perpendicular to the detection axis direction of the magnetic sensor element 11 is longer than the length of the second magnetic field attenuation unit 13 in the direction perpendicular to the detection axis direction of the magnetic sensor element 11.

Namely, in Example B2, as shown in the cross-sectional view of FIG. 9(b), neither of the virtual planes including the third magnetic field attenuation unit 14 intersects the second magnetic field attenuation unit 13, and are arranged on the outside of the surface of the second magnetic field attenuation unit 13. Specifically, the first magnetic field attenuation unit 12 and the second magnetic field attenuation unit 13 are arranged with their centers in the Z-axis direction matched. The lead 121 extending from the magnetic sensor element 11 is introduced through openings formed on opposite sides in the Z-axis direction of the second magnetic field attenuation unit 13. In this example, the first magnetic field attenuation unit 12 and the third magnetic field attenuation unit 14 may be integrated to form a substantially Π shaped magnetic field attenuation body.

In the example shown in FIG. 9, the first magnetic field attenuation unit 12 and the second magnetic field attenuation unit 13 are arranged with their centers in the Z-axis direction matched. However, as exemplified in FIG. 10(a) and FIG. 10(b), two second magnetic field attenuation units 13a and 13b may be used, and these second magnetic field attenuation units may be magnetically connected to the third magnetic field attenuation units 14a and 14b, respectively, and may be magnetically integrated therewith (Example B3). With this structure, the entirety of the first, second, and third magnetic field attenuation units 12, 13, and 14 forms an integral magnetic field attenuation body, and its cross-section along X(b)-X(b) on the ZX-plane has a substantially C shape, as exemplified in FIG. 10(b).

Figure 10:
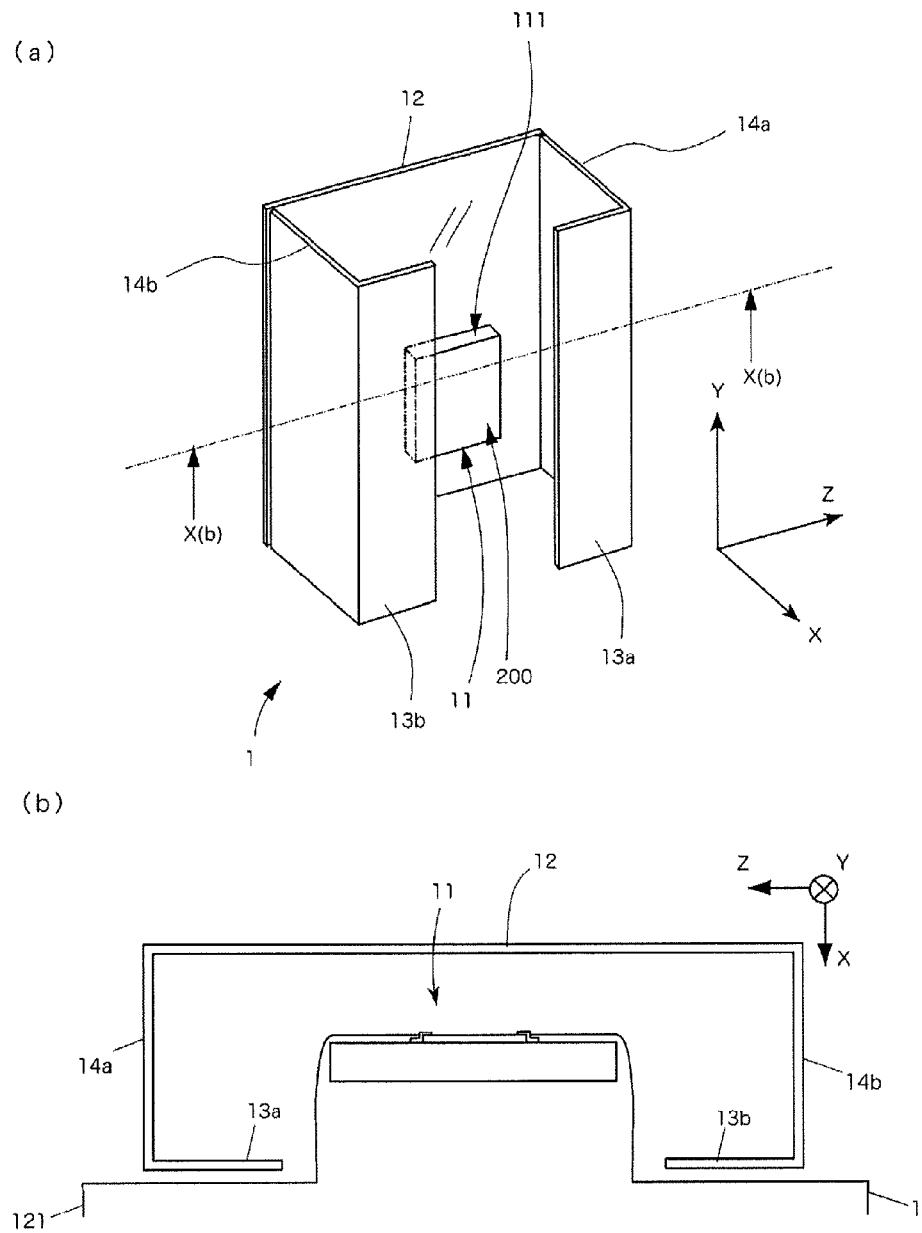
FIG. 10 is an explanatory view showing an outline of still another example of a magnetic sensor device according to an embodiment of the present disclosure.
Figure 11:
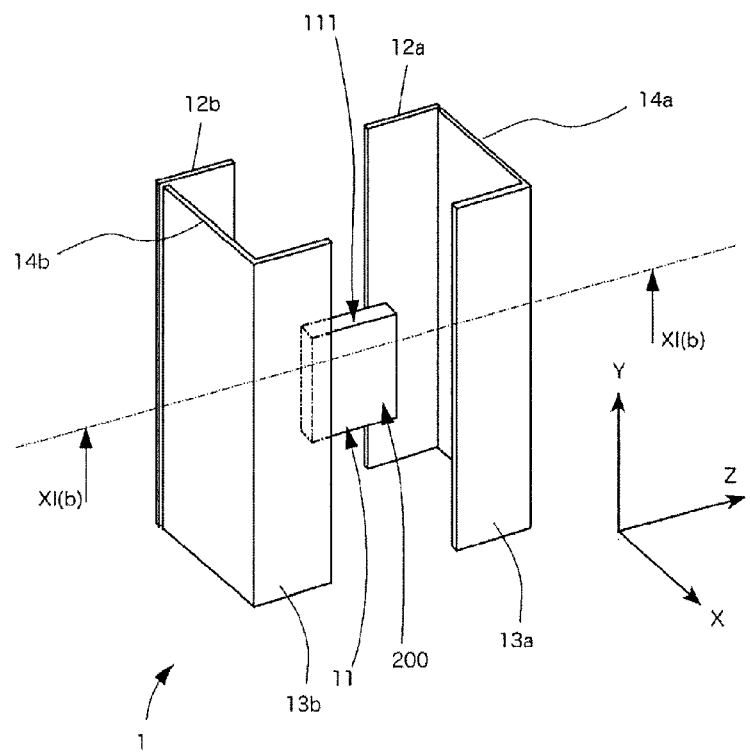
FIG. 11 is an explanatory view showing an outline of still another example of a magnetic sensor device according to an embodiment of the present disclosure.
Figure 11:
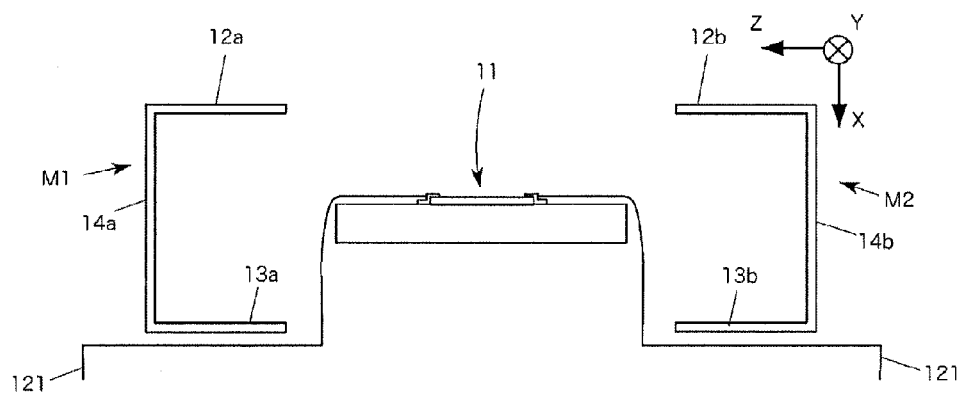

Further, based on Example B3 shown in FIG. 10, the first magnetic field attenuation unit 12 may have a different shape by removing a portion within a predetermined range from the center in the Z-axis direction (Example B4). As exemplified in FIG. 11(a) and FIG. 11(b), Example B4 has two first magnetic field attenuation units 12a and 12b, and two second magnetic field attenuation units 13a and 13b. The first magnetic field attenuation unit 12a, the second magnetic field attenuation unit 13a, and the third magnetic field attenuation unit 14a may be magnetically connected and magnetically integrated, while the first magnetic field attenuation unit 12b, the second magnetic field attenuation unit 13b, and the third magnetic field attenuation unit 14b may be magnetically connected and magnetically integrated. With this structure, there are a magnetic field attenuation body formed by magnetically connecting and magnetically integrating the first magnetic field attenuation unit 12a, the second magnetic field attenuation unit 13a, and the third magnetic field attenuation unit 14a, and a magnetic field attenuation body formed by magnetically connecting and magnetically integrating the first magnetic field attenuation unit 12b, the second magnetic field attenuation unit 13b, and the third magnetic field attenuation unit 14b. As exemplified in FIG. 11(b), the cross-section along XI(b)-XI(b) in the ZX-plane has a shape in which two substantially C-shaped magnetic field attenuation bodies M1 and M2 have C-shaped openings at ends in the Y-axis direction, and the two C-shaped openings adjacent in the Z-axis direction define one rectangular opening. The magnetic sensor element 11 is arranged between the two magnetic field attenuation bodies M1 and M2. In Examples B2, B3, and B4 shown in FIG. 9 to FIG. 11, the entirety of the magnetic sensor element 11 and the magnetic field attenuation bodies may be resin molded. In FIG. 9 to FIG. 11, the resin mold is not shown for easy explanation. The size of the magnetic sensor element 1 relative to the magnetic field attenuation body may be made larger compared to the example shown in FIG. 7, so that the magnetic sensor element 1 is constituted to have two C-shaped magnetic field attenuation bodies fitted therein.

Figure 12:
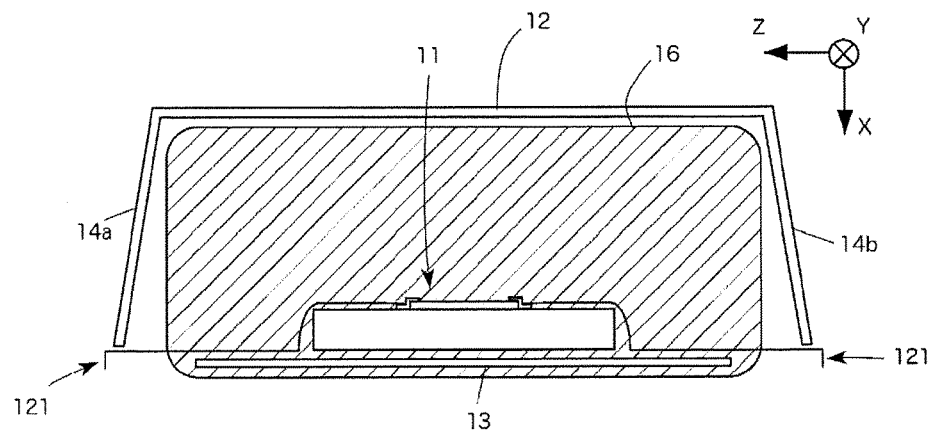
FIG. 12 is a cross-sectional view showing an example of a magnetic sensor device according to an embodiment of the present disclosure.

With respect to the example shown in FIG. 9, as can be seen from FIG. 12 which shows a cross-sectional view corresponding to FIG. 9(b) and when molding with resin 16 is applied, the entirety may not be molded, but instead, the magnetic sensor element 11 and the second magnetic field attenuation unit 13 may be molded, while the lead 121 of the magnetic sensor element 11 is introduced to the outside, and the magnetic field attenuation body formed by integrating the first magnetic field attenuation unit 12 and the third magnetic field attenuation units 14a and 14b is attached to the external side of the mold. The third magnetic field attenuation units 14a and 14b may be formed so that the closer to the second magnetic field attenuation unit 13, the wider the width in the Z-axis direction. The attenuation effect can be obtained even if a material having a weak bending resistance, such as amorphous, etc., is used for the second magnetic field attenuation unit 13 and the third magnetic field attenuation unit (FIG. 12). In this case, the second magnetic field attenuation unit 13 may be formed as wide as possible within the molded area.

Figure 13:
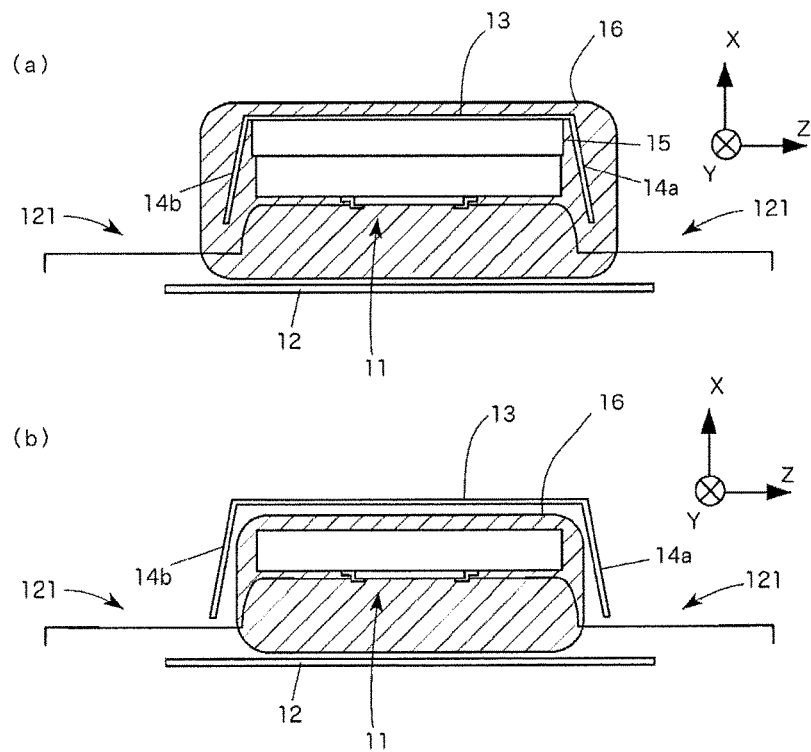
FIG. 13 is a cross-sectional view showing another the example of a magnetic sensor device according to an embodiment of the present disclosure.

Further, with respect to Example B1 shown in FIG. 7 and FIG. 8, as exemplified in FIG. 13(a), the entirety may not be molded with the resin 16, but the magnetic sensor element 11, the second magnetic field attenuation unit 13, and the third magnetic field attenuation unit 14 may be molded while arranging the first magnetic field attenuation unit 12 on the outside of the mold and at the position opposing to the second magnetic field attenuation unit 13 with the magnetic sensor element 11 therebetween.

As exemplified in FIG. 13(b), only the magnetic sensor element 11 may be molded with the resin 16, while arranging, on the external side of the mold, the first magnetic field attenuation unit 12 and the second magnetic field attenuation unit 13 with the magnetic sensor element 11 therebetween, and the third magnetic field attenuation units 14a and 14b in the Z-axis direction with the magnetic sensor element 11 therebetween. The third magnetic field attenuation units 14a and 14b may be formed so that the closer to the first magnetic field attenuation unit 12, the wider the width in the Z-axis direction (FIG. 13(a) and FIG. 13(b)). In case of the latter, spacer 15 may not be always necessary.

Figure 14:
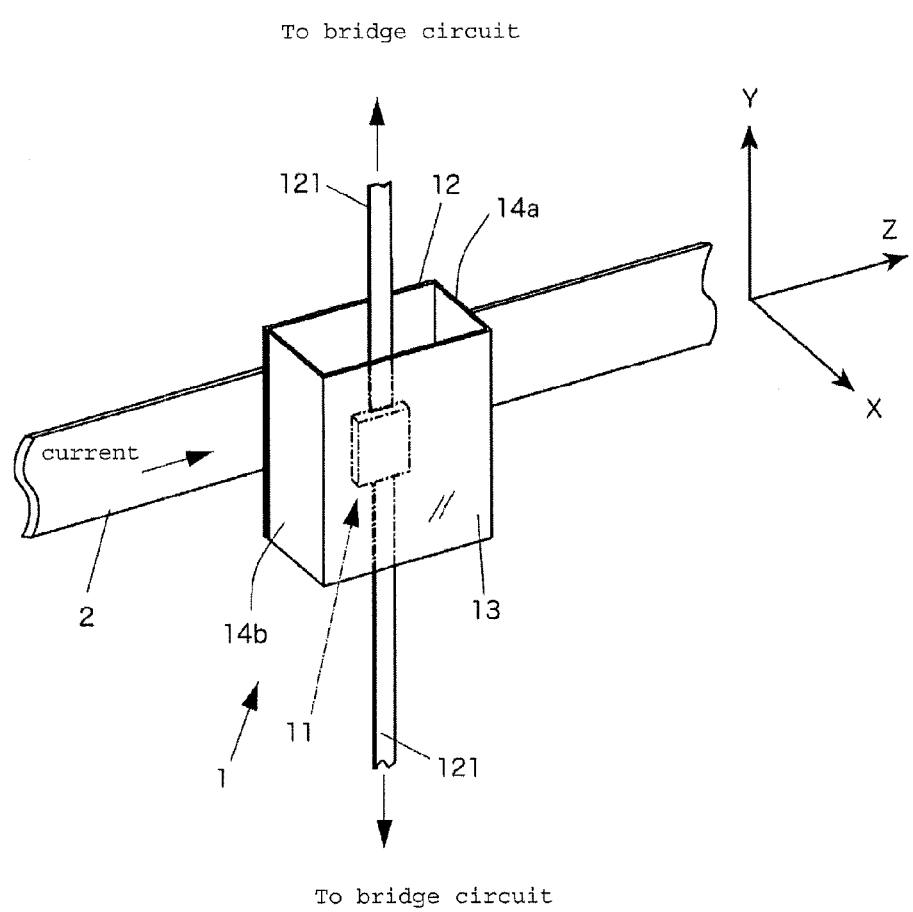
FIG. 14 is an explanatory view showing an example of how a magnetic sensor device according to an embodiment of the present disclosure is used.

The magnetic sensor device 1 according to the present embodiment is constituted as above example, and as exemplified in FIG. 14, according to an example of the present embodiment, the magnetic sensor device 1 is used for detecting the current value flowing through a conductor. In FIG. 14, the magnetic sensor device 1 according to Example B1 is shown, but the magnetic sensor device 1 may be any one of Examples A1 and A2, and Examples B2 to B4.

Specifically, when the magnetic sensor device 1 is used for detecting the current value flowing through a conductor, the conductor 2 is arranged with its current direction aligned with the Z-axis, and the magnetic sensor device 1 is arranged so that the first magnetic field attenuation unit 12 is located between the conductor 2 and the magnetic sensor element 11. Here, the conductor 2 may be a long and thin metal conductor (usually referred to as a bus bar). As exemplified in FIG. 15(a), the bus bar may have a hair-pin like U shape, and the current may flow in one direction (forwarding path) along the Z-axis near the magnetic sensor device 1, and when the bus bar is turned back at another portion, the current may flow in the other direction (returning path) along the Z-axis near the magnetic sensor device 1. When this bus bar is viewed near the magnetic sensor device 1 from the viewpoint parallel with the Z-axis in FIG. 15(a), as exemplified in FIG. 15(b), the forwarding path and the return path of the bus bar are arranged in parallel with a distance therebetween in the X-axis direction (the positions in the Y-axis direction are aligned). Further, in FIG. 14 and FIG. 15, the first magnetic field attenuation unit 12 is located between the conductor 2 and the element 11, but the conductor 2 may be located between the first magnetic field attenuation unit 12 and the element 11, or between the second magnetic field attenuation unit 13 and the element 11. By arranging the conductor 2 as above, the influence of the external disturbance magnetic field can be reduced, and more precise measurement becomes possible.

Figure 15:
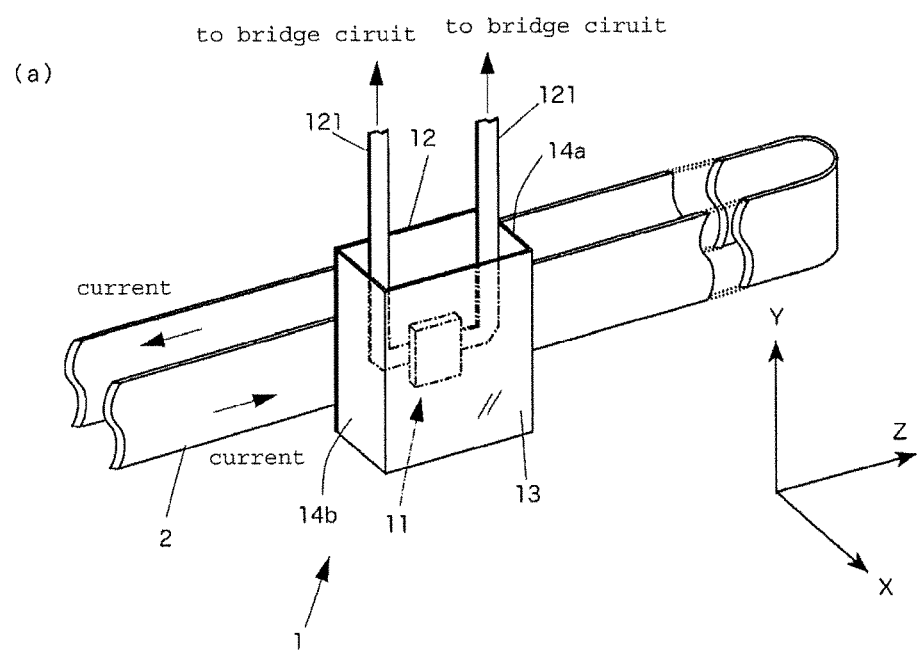
FIG. 15 is an explanatory view showing another example of how a magnetic sensor device according to an embodiment of the present disclosure is used.
Figure 15:
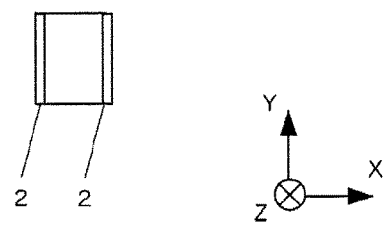

As in FIG. 14 and FIG. 15, when the first magnetic field attenuation unit 12 is located closer than is the magnetic sensor 11 to the conductor 2, i.e., the source of magnetic fields, the intensity of the magnetic field to be applied to the first magnetic field attenuation unit 12 is usually higher than the intensity of the magnetic field to be applied to the magnetic sensor 11. Accordingly, when the volumes, sizes, and thicknesses are compared, the first magnetic field attenuation unit 12 may be formed larger and thicker than the second magnetic field attenuation unit 13. The introducing direction of the lead 121 is different between FIG. 14 and FIG. 15, and this means that the lead may be introduced in either direction. With this structure, when the current flows through the conductor 2, the magnetic sensor element 11 presents a resistance value corresponding to the intensity of the magnetic field generated nearby.

The resistance value between the two leads 121 introduced to the outside of the magnetic sensor device 1 (resistance value presented by the magnetic sensor element 11) can be obtained by, for example, constituting a Wheatstone bridge with three resistors having known resistance values and the magnetic sensor device 1, and measuring the resistance value presented by the magnetic sensor element 11 of the magnetic sensor device 1 by this bridge circuit.

Figure 16:
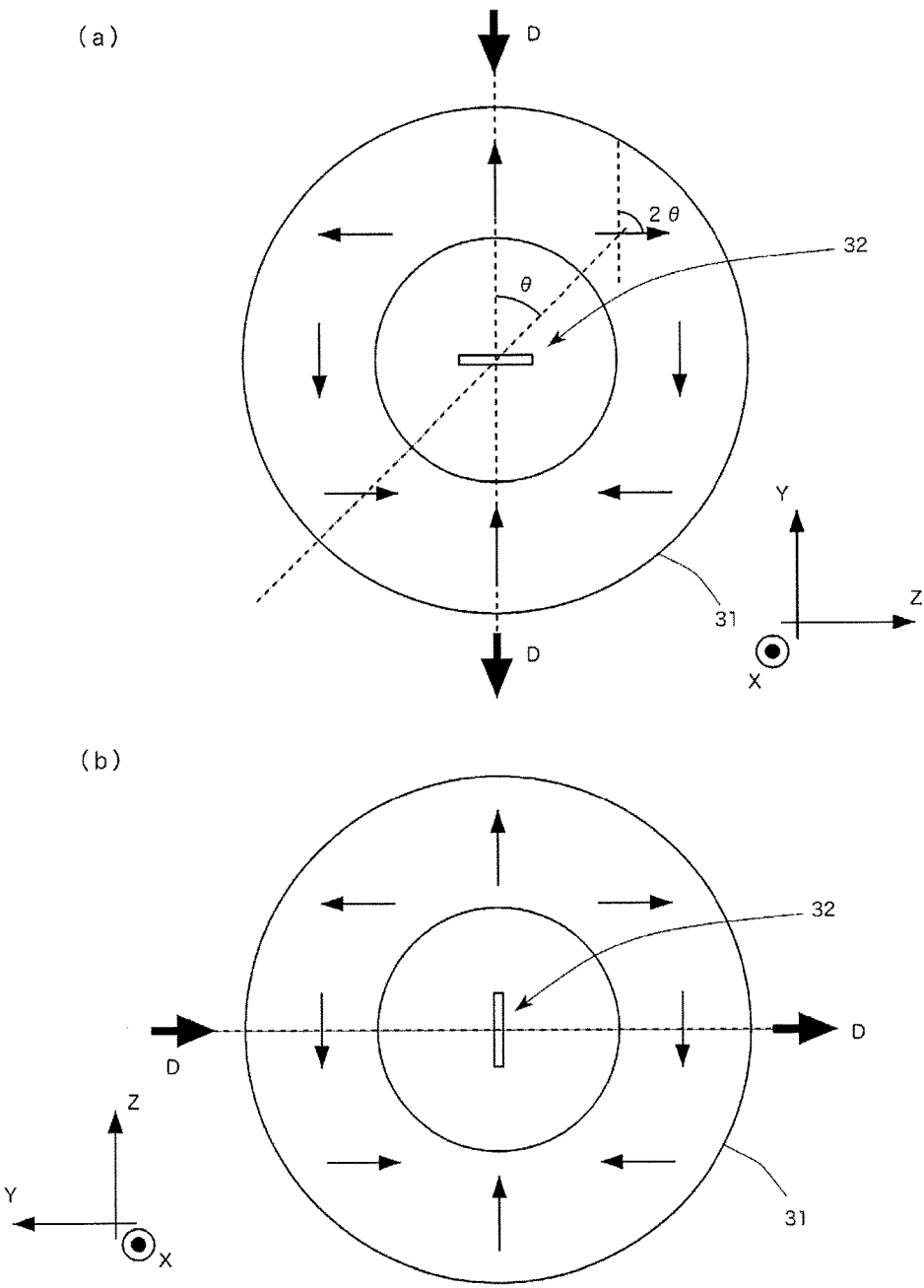
FIG. 16 is an explanatory view showing an example of a magnetic sensor element in a magnetic sensor device according to an embodiment of the present disclosure.

As exemplified in FIG. 16(a) and FIG. 16(b), conceptually, the magnetic sensor element 11 of the magnetic sensor device 1 according to the present embodiment comprises an annular magnetic body 31 formed in a plane, and a magnetoresistance effect element 32 arranged at the center thereof. The magnetic body 31 is magnetized in a way so that when two positions are located in circumferential directions from the center different by an angle of θ, magnetization directions at these positions are different by 2θ, namely, the magnetization directions are rotated 360 degrees over the half of the periphery (in FIG. 16, the magnetization directions are shown by arrows). This arrangement is known and usually referred to as the Halbach array.

In the example of FIG. 16(a), the magnetoresistance effect element 32 is an SVGMR (Spin Valve Giant Magnetoresistive) element in which the width direction thereof (the direction perpendicular to the longitudinal direction of the magnetoresistance effect element 32 itself) is a detection axis direction (above described Y-axis direction). The magnetoresistance effect element 32 according to the example shown in FIG. 16(a) comprises a fixed layer having a magnetization direction fixed to the width direction thereof (the layer having a magnetization direction which is not changed by the external magnetic field). For the structure of FIG. 16(a), a feedback type current sensor may be used.

In the present embodiment, the magnetic body 31 and the magnetoresistance effect element 32 are arranged so that the width direction of the magnetoresistance effect element 32 matches with the direction D (Y-axis direction in FIG. 16(a)) of the magnetic field to be measured.

According to another example of the present embodiment, as exemplified in FIG. 16(b), the magnetic body 31 and the magnetoresistance effect element 32 may be arranged so that the direction D (Y-axis direction) of the magnetic field to be measured and the width direction of the magnetoresistance effect element 32 become perpendicular to the direction of the magnetic flux (Z-axis direction) applied from the magnetic body 31 to the magnetoresistance effect element 22 arranged near the center thereof (namely, matches with the Y-axis direction). In this case, the magnetic body 31 and the magnetoresistance effect element 32 are arranged so that the width direction of the magnetoresistance effect element 32 becomes perpendicular to the direction of the magnetic flux applied from the magnetic body 31 to the magnetoresistance effect element 32. For the structure of FIG. 16(b), a magnetic proportion type current sensor may be used.

Figure 17:
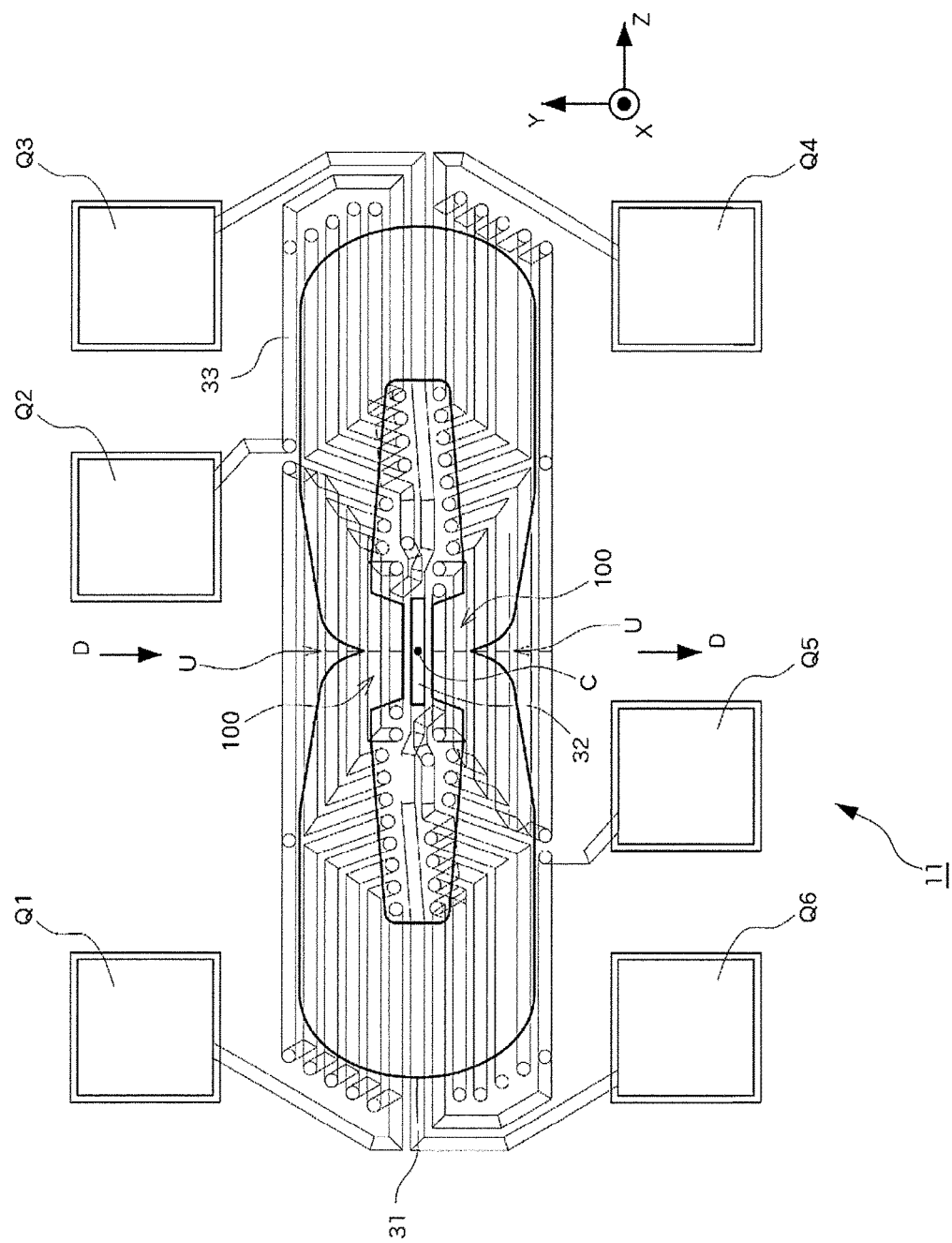
FIG. 17 is a plain perspective view showing another example of a magnetic sensor element in a magnetic sensor device according to an embodiment of the present disclosure.

FIG. 17 shows an example of a specific example of the magnetic sensor element 11 on the basis of the concept of FIG. 16(a). The magnetic sensor element 11 according to an example of the present embodiment is provided with an annular magnetic body 31 having a longitudinal size different from the lateral size, a magnetoresistance effect element 32 arranged near the center C of the magnetic body 31, and layers respectively stacked on the magnetic body 31 to hold the magnetic body 31 therebetween, the layers respectively containing a lower pattern 33a of a coil 33 and an upper pattern 33b of the coil 33. This magnetic sensor device 31 is capable of measuring the magnetic field externally applied in the D direction (negative Y-axis direction) in FIG. 17.

Here, the magnetic body 31, and the lower pattern 33a and the upper pattern 33b of the coil 33 are overlapped, and partly hidden in the plan view, and thus, actually, are not easily visible. However, in FIG. 17 showing a plan view, the magnetic body 31, the magnetoresistance effect element 32, and the coil 33 are shown with transparency.

The magnetic body 31 is made of, for example, an iron-nickel alloy (permalloy), and has a thickness of 1 μm, saturation magnetic flux density Bs of 1.45 T, and initial magnetic permeability μi of 2000, in an example of the present embodiment. Further, this magnetic body 31 has a narrowed portion 100 narrowed toward the magnetoresistance effect element 32 at a position where the line extending in the minor-axis direction through the center C (the center both in the width direction and the longitudinal direction) of the magnetic body 31 intersects the magnetic body 31. Thereby, both the outer periphery and the inner periphery of the magnetic body 31 have substantially dumbbell shapes (the shape formed by connecting two pieces of C-shape arranged by opposing the openings thereof, or the shape formed by connecting two pieces of 3-shape opposing to each other so that the upper portion of the upper arc of "3" is connected to the lower portion of the lower arc of the other "3"). Here, the inner periphery of the magnetic body 31 is formed to be symmetry with respect to the line passing though the center C and parallel with the Y-axis, and other than the narrowed portion 100, the width w in the Y-axis direction of the inner periphery is gradually reduced as the distance from the center increases. Portions Ly of the magnetic body 31 which extend substantially parallel with the Y-axis are formed to have a wider width than other portions. Thereby, the magnetic body 31 cannot be easily saturated when a large external magnetic field is applied. For example, when the width of Ly is 100 μm, the external magnetic field can be applied about 3182 A/m (40 Oe), when 150 μm, about 3422 A/m (43 Oe) can be applied, and when 200 μm, about 3740 A/m (47 Oe) can be applied.

The narrowed portion 100 of the magnetic body 31 is tapered so that the width is gradually reduced toward the magnetoresistance effect element 32. Further, a notch U may be formed on the outer peripheral side of the narrowed portion 100 (a position on the outer periphery where the line passing through the center and extending in the minor-axis direction intersects), the notch being notched toward the center C, namely, toward the magnetoresistance effect element 32. The coil 33 is wound around this magnetic body 31 to form magnetic fields so that the directions of the magnetic fields are distributed to spatially rotate 360 degrees in the peripheral direction over the half of the periphery of the magnetic body 31.

According to an embodiment of the present disclosure, the magnetic body 31 is formed so that the width of the magnetic body 31 at the position where the line passing through the center C and extending in the minor-axis direction intersects is narrower than the width of the magnetic body 31 at the position where the line passing through the center C and extending in the major-axis direction intersects.

The magnetoresistance effect element 32 is, for example, a spin-valve giant magnetoresistance effect element (SVGMR element), having a fixed layer magnetized in the width direction (the direction perpendicular to the longitudinal direction), and presenting a resistance value corresponding to the intensity of the magnetic field in the width direction. According an example of the present embodiment, the magnetoresistance effect element 32 is arranged so that the width direction (detection axis direction) thereof becomes parallel to the Y-axis.

The coil 33 comprises a lower pattern 33a arranged on the surface stacked on the lower side than the surface having the magnetic body 31, and an upper pattern 33b arranged on the surface stacked on the upper side than the surface having the magnetic body 31. The lower pattern 33a is shown in FIG. 18(a), and the upper pattern 33b is shown in FIG. 18(b). In FIG. 18(a) and FIG. 18(b), circler portions indicate positions of via holes. Via holes are located at corresponding positions on the upper pattern 33b and the lower pattern 33a to electrically connect the corresponding circler portions through the via holes. The lower pattern 33a and the upper pattern 33b are electrically connected by rectangular pads Q1 to Q6. In the explanation below, the major-axis direction of the magnetic body 31 is referred to as the Z-axis (in the Figure, the direction to the left is the negative direction of the Z-axis), whereas the direction perpendicular to this direction is referred to as Y-axis (in the Figure, the upward direction is the positive direction of Y-axis).

In addition, the lower pattern 33a and the upper pattern 33b comprise portions which are symmetry with respect to the center of the annular magnetic body 31.

FIG. 19(a) shows a portion of the lower pattern 33a shown in FIG. 18(a), which is a portion on the positive direction side of the Y-axis from the lines parallel to the major-axis of the magnetic body 31 (line corresponding to the axis of symmetry). FIG. 19(b) shows a portion of the upper pattern 33b shown in FIG. 18(b), which is a portion on the positive direction side of the Y-axis from the lines parallel to the major-axis of the magnetic body 31 (line corresponding to the axis of symmetry). At least a portion of the winding wire pattern is not liner, and comprises a parallel portion L parallel to Z-axis and a portion obliquely intersecting the parallel portion L (a portion intersecting the magnetic body in the peripheral direction so as to be inclined at an angle within a predetermined angle range, hereinafter referred to as an inclined portion) S. Namely, this pattern is bent in mid-course.

The winding wire T1 of the lower pattern 33a in FIG. 19(a) is connected from the pad Q1 through the via hole H1-H1' to the winding wire T1' of the upper pattern 33b shown in FIG. 19(b). The winding wire T1' of the upper pattern 33b is connected through the via hole H12'-H12 to the winding wire T2 of the lower pattern 33a.

The winding wire T2 includes an inclined portion S2, and is connected through the via hole H2-H2' to the winding wire T2' of the lower pattern 33b. This winding wire T2' also includes an inclined portion. Subsequently, winding wires T3, T3', T4 . . . , T5' are wound around the magnetic body 31 while the wires are arranged to form the lower pattern 33a and the upper pattern 33b through the corresponding via holes.

Here, the among the winding wires T1, T2 . . . , T5, and among the winding wires T1', T2' . . . , T5', the further the winding wire located to the positive negative of the Z-axis, the longer the inclined portion S. The inclined angle of the inclined portion S relative to Y-axis is constant, and is, for example, 20 degrees (70 degrees relative to the Z-axis).

The winding wire T6 is connected through the via hole H6-H6' to the winding wire T7' of the upper pattern 33b. The winding wire T7' is connected through the via hole H7'-H7 to the Z-shaped winding wire T7 of the lower pattern 33a. The winding wire T7 includes two inclined portions S7-1 and S7-2, and a parallel portion P7. The line extending from the inclined portion S7-1 is symmetric to the line extending from the inclined portion S7-2, with respect to the Y-axis. The winding wire T7 is connected through the via hole H17-H17' to the Π-shaped winding wire T8' of the upper pattern 33b. Subsequently, winding wires T8, T9', T9 . . . , T11, T12' are wound around the magnetic body 31 while the wires are arranged to form the lower pattern 33a and the upper pattern 33b through the corresponding via holes. At least a part (in FIG. 19, T8, T9, T8', T9') of the winding wires T8, T9 . . . , T11, and T8', T9', . . . T11', are respectively provided with two inclined portions S to have shapes substantially symmetric with respect to the Y-axis, except for the edges such as connecting portions.

In the present example, the winding wires T10, T11, T11', T12' are structured so that the portions of the wires substantially parallel to the X-axis are wound around the narrowed portion 100 of the magnetic body 31. The winding wire T12' is connected through the via hole H112'-H112 to the winding wire T12. The winding wires T12 . . . T16, and T13' . . . T16' substantially have shapes respectively symmetric to the shapes of the winding wires T5, T4 . . . , T1, T5', . . . T2' with respect to the Y-axis. The winding wire T16 is connected through the via hole H116-H116' to the winding wire T17', and the winding wire T17' is connected through the via hole H117'-H117 to the pad Q2.

Figure 18:
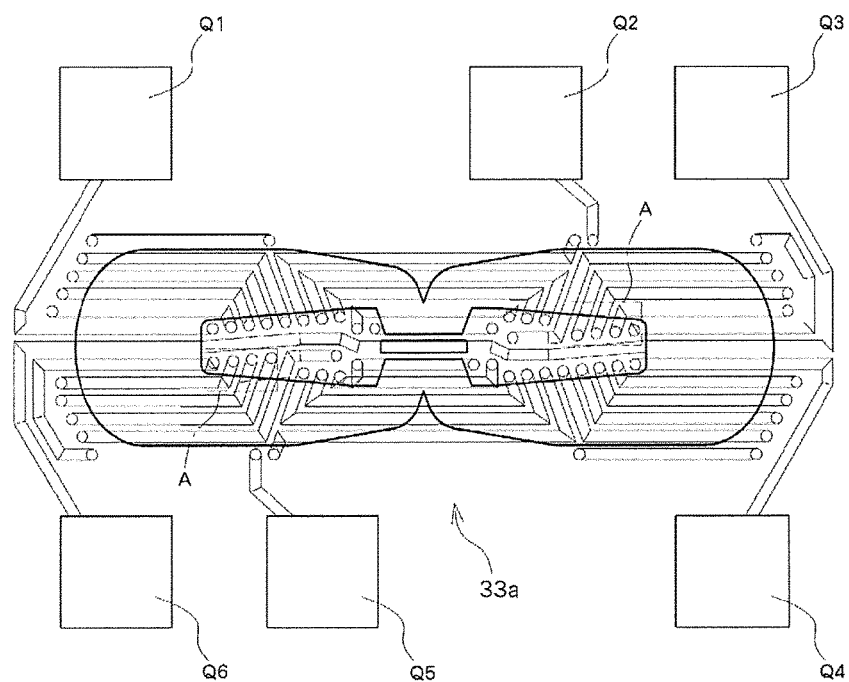
FIG. 18 is an explanatory view showing an example of a coil arrangement of a magnetic sensor element in a magnetic sensor device according to an embodiment of the present disclosure.
Figure 18:
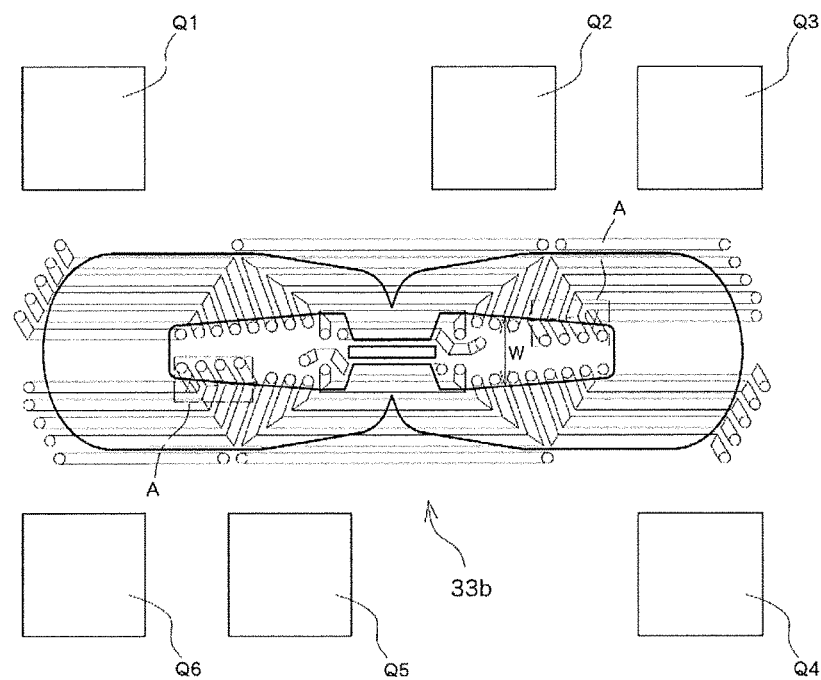
Figure 19:
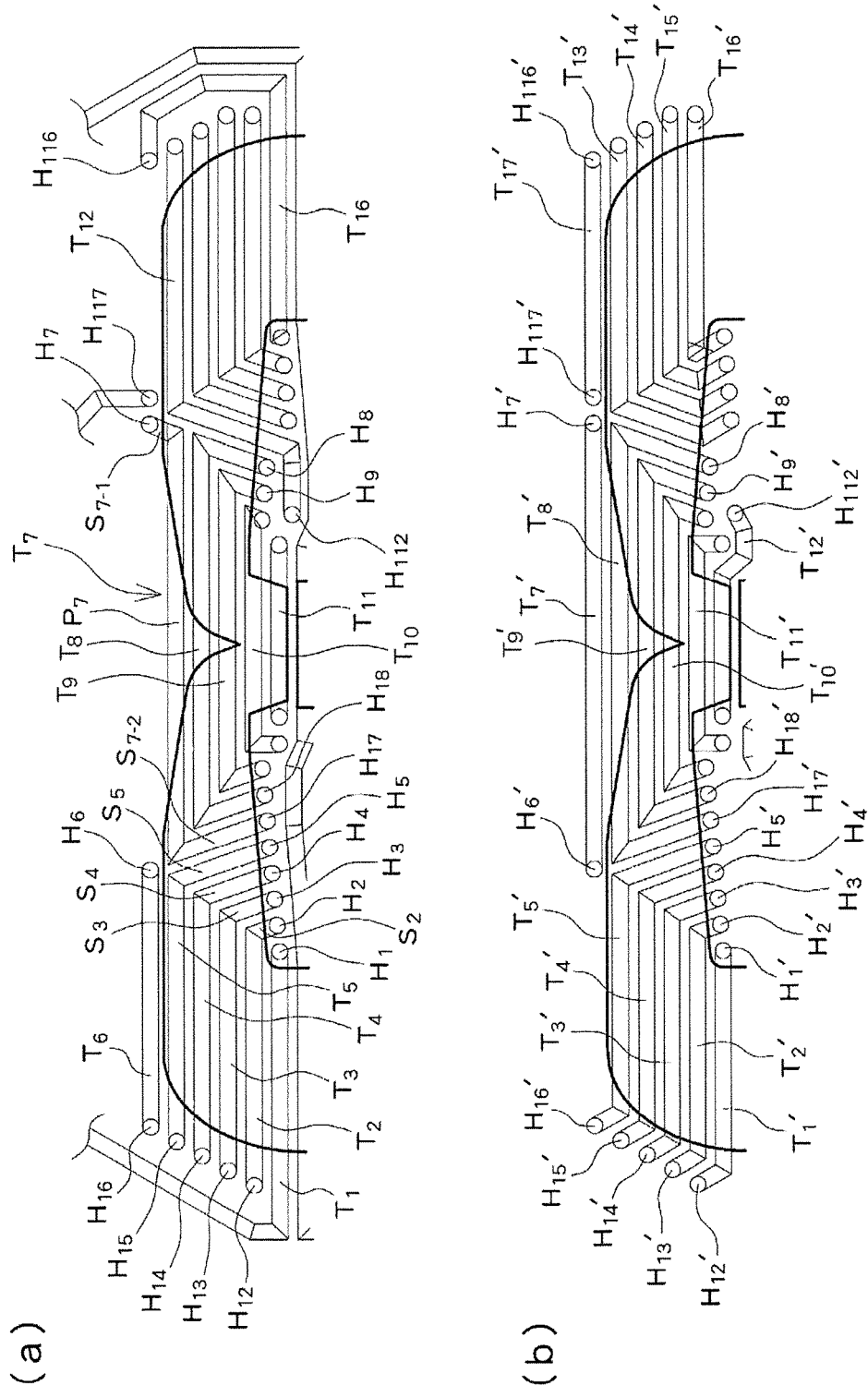
FIG. 19 is an explanatory view showing an example of a coil arrangement of a magnetic sensor element in a magnetic sensor device according to an embodiment of the present disclosure.

In the example of FIG. 18, the pad Q3 is wired to the lower pattern 33a, and is connected to one end of the terminal of the magnetoresistance effect element 32. The pad Q6 is wired to the layer same as the layer of the lower pattern 33a, and is connected to the other end of the terminal of the magnetoresistance effect element 32.

Figure 20:
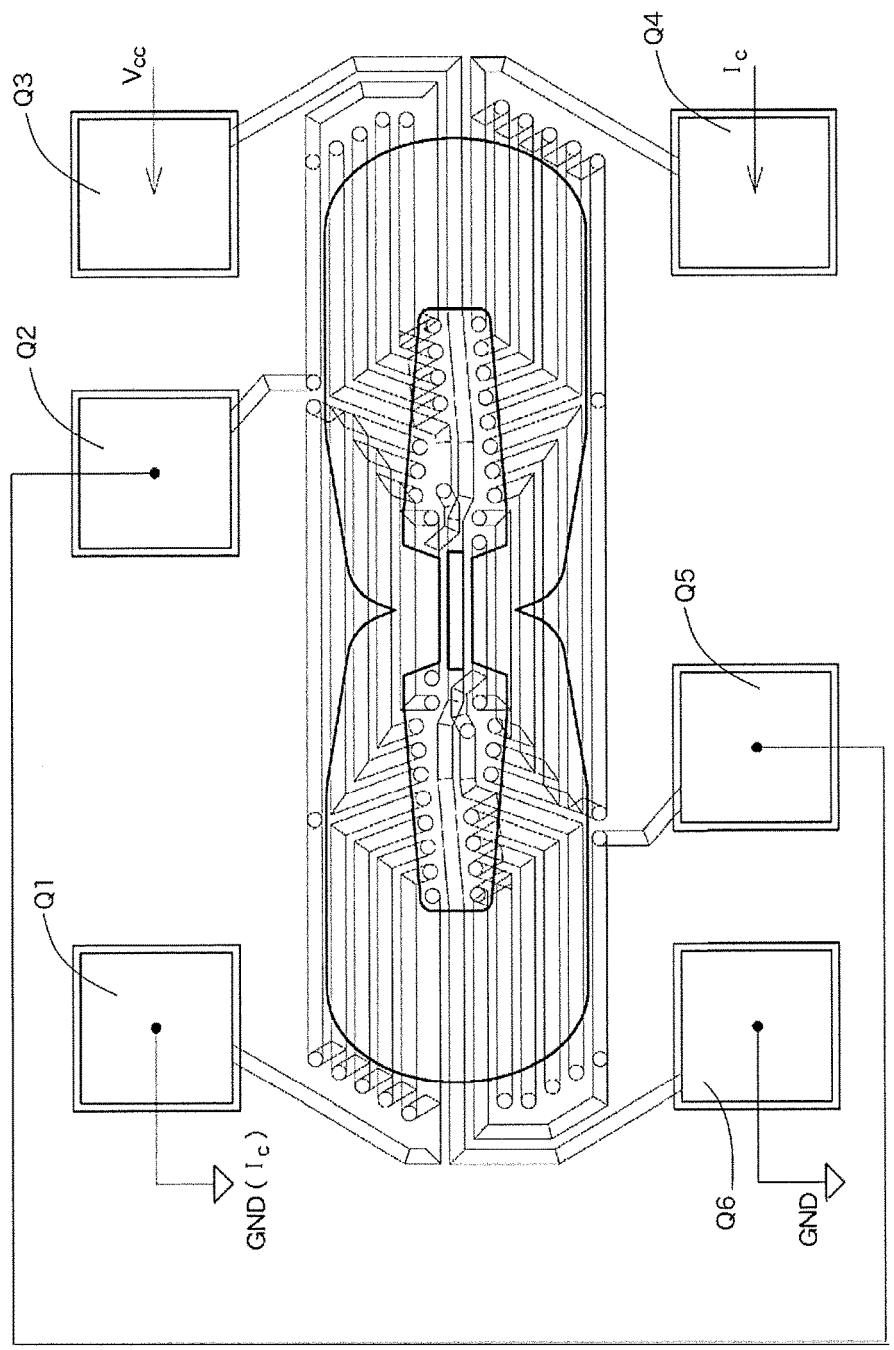
FIG. 20 is an explanatory view showing an example of a connection of a magnetic sensor element in a magnetic sensor device according to an embodiment of the present disclosure.

According to an example of the present embodiment, as exemplified in FIG. 20, the coil current Ic is applied to the pad Q4. The pad Q5 is connected to the pad Q2. Further, the pad Q1 is connected to the common terminal (GND) of the coil current Ic. The supply voltage Vcc of the magnetoresistance effect element 32 is applied to the pad Q3. The pad Q6 defines a common terminal (GND). Namely, in the present example, six leads to be connected to pads Q1, Q4, Q3, and Q6 are extended from a package of the molded magnetic sensor device 1. The lead to connect the pads Q2 and Q5 is wired on the external side of the package.

The coil current Ic applied to the pad Q4 flows through the coil 33, and thereby, the coil 33 magnetizes the magnetic body 31 so that at positions deviated from each other at an angle of θ from the center, the magnetization directions are different by 2θ, namely, magnetizes to have the Halbach array. In the present example, the magnetic body 31 is magnetized in the direction same as the narrowing down direction of the narrowed portion 100 (namely, in the direction parallel to the width direction of the magnetoresistance effect element 32).

Figure 21:
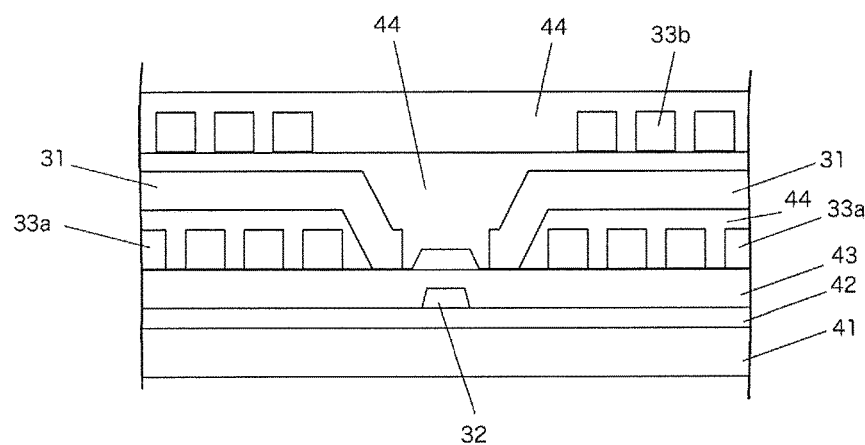
FIG. 21 is a cross-sectional view showing an example of a magnetic sensor element in a magnetic sensor device according to an embodiment of the present disclosure.

FIG. 21 is an example of a cross-sectional view schematically showing a part of the magnetic sensor element 11 exemplified in FIG. 17, broken along a direction parallel with the detection axis direction. For easy understanding, FIG. 21 shows the outline of the arrangement of the coil 33, etc., by reducing the number of windings, etc. The magnetic sensor element 11 according to an example of the present embodiment exemplified in FIG. 21, is produced as mentioned below. Namely, an insulation layer 42 consisting of two layers ($SiO_2$ (substrate side) and $Al_2O_3$ (insulation film 43 side)) is formed on a substrate 41, and even numbers of magnetoresistance effect elements 32 (SVGMR element films) each having a width of 10 μm, are formed thereon, by thin film processes. In addition, an insulation film 43 thicker than the film of the magnetoresistance effect element 32 is formed thereon, and further, a magnetic body 31 made of permalloy, etc., and a lower pattern 33a of a coil 33 wound around the magnetic body 31 are formed on the insulation film 22, and a resin 44 (insulation body) is provided for sealing. Then, via holes H are formed on the resin 44, and conductors are formed on the lower pattern 33a, so that the positions of the conductors correspond to the positions of the via holes H. Next, an upper pattern 33b of the coil 33 to be connected to these conductors is formed, and the resin 44 (insulation body) is further provided for sealing. A Pad Q which is to be conductively connected to the coil 33, is exposed from the resin. The magnetic body 31 is arranged to have a space of about 2 μm from each of the opposite sides in the magnetic flux direction of the magnetoresistance effect element 32. In the present example, the magnetoresistance effect element 32 is arranged on the substrate 41 side (lower layer side) from the magnetic body 31, and the portions of the magnetic body 31 near the center C may be extended to the lower layer side toward the magnetoresistance effect element 32.

Figure 22:
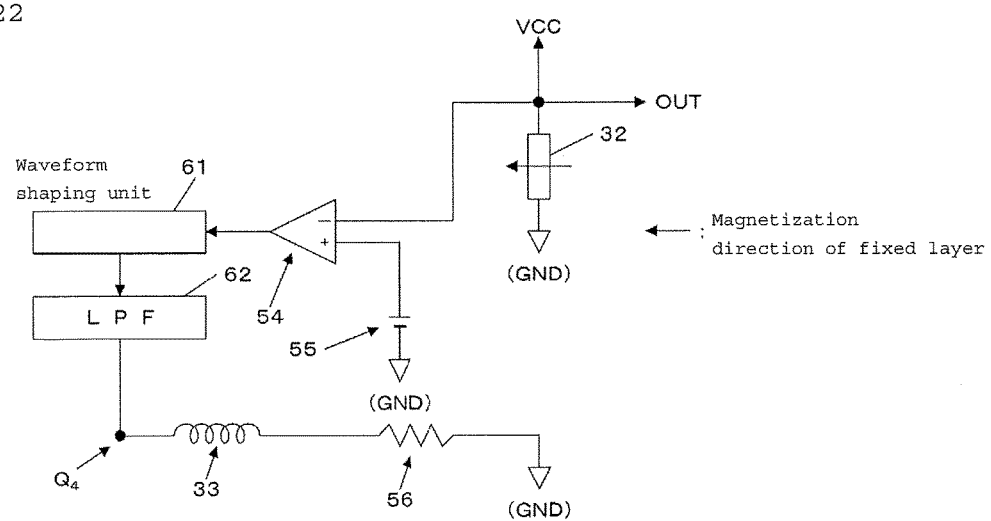
FIG. 22 is a schematic circuit view showing an example of a circuit for another example of a magnetic sensor element in a magnetic sensor device according to an embodiment of the present disclosure.

The magnetic sensor element 11 according the present example can be used for what is referred to as a magnetic balance circuit. As exemplified in FIG. 22, in this circuit, a lead extended from one end of the magnetoresistance effect element 32 is connected to receive a DC bias supply voltage Vcc, and is also connected to the negative (−) terminal of a comparator 14. The negative (−) terminal of the comparator 54 is also connected to an output terminal (OUT). A lead extended from the other end of the magnetoresistance effect element 32 is connected to a common terminal (GND). The positive (+) terminal of the comparator 14 is connected to a common terminal (GND) through a reference supply 55. The output potential of the reference supply 55 defines a potential of the magnetoresistance effect element 32 where no magnetic field is present. The negative (−) terminal of the comparator 54 is connected to Vcc, but the potential thereof is changed (although slightly) depending on the interconnect resistance and the resistance value of the magnetoresistance effect element 32.

The output of the comparator 54 is connected to an end of the coil 33 (pad Q4) through a waveform shaping unit 61 and a low-pass filter (LPF) 62. Further, the other end of the coil 33 (pad Q6) is connected to a common terminal (GND) through a fixed resistor 56.

The circuit of the magnetic sensor device 1 according to the example of the present embodiment receives a voltage signal output from the magnetoresistance effect element 32 through the comparator 54, the waveform shaping unit 61, and the LPF 62. The output received through the LPF 62 is a voltage signal proportional to the difference between the potential of the reference supply and the potential of the voltage signal output from the magnetoresistance effect element 32.

If the magnetic sensor device 1 is arranged near a conductor (for example, bus bar) through which a current to be measured flows, the resistance value of the magnetoresistance effect element 32 is varied due to the induction magnetic field caused by the current to be measured. Thus, the output potential is offset from the potential when no magnetic field is present (as mentioned above, the potential of the reference supply has been set equal to this potential), and the output received through the comparator 54, the waveform shaping unit 61, and the LPF 62 is a voltage signal having a value corresponding to the offset value of the potential. This voltage signal indicates the intensity of the induction magnetic field caused by the current to be measured (current flowing through bus bar).

This voltage signal is supplied to one end of the coil 33 to flow a current through the coil 33, and thereby, a magnetic field (cancel magnetic field) is generated. The magnetic flux caused by this cancel magnetic field and the induction magnetic field caused by the current to be measured are applied through the magnetic body 31 to the magnetoresistance effect element 32. When the magnetic flux passing through the magnetoresistance effect element 32 becomes zero (when the output voltage of the magnetoresistance effect element 32 becomes equal to the reference potential 55), a voltage signal V in proportion to the value of the current supplied to the coil 33 is extracted (OUT). This voltage signal V becomes an output signal proportional to the value of the current to be measured (in the above example, the current flowing through the bus bar).

The magnetic sensor element 11 embodied on the basis of the concept exemplified in FIG. 16(*b*) has a structure same as the structure exemplified in FIG. 17 to FIG. 20, except that the magnetoresistance effect element 32 is arranged in the direction perpendicular to the magnetization direction by the coil 33, and accordingly, the detection axis direction is in parallel or antiparallel with the Z-axis in FIG. 17 to FIG. 20. The structure of the magnetoresistance effect element 32 of the magnetic sensor element 11 is the same as the structure exemplified in FIG. 21. The shape of the magnetic body 31 may be different between the feedback type current sensor and the magnetic proportional type current sensor.

Figure 23:
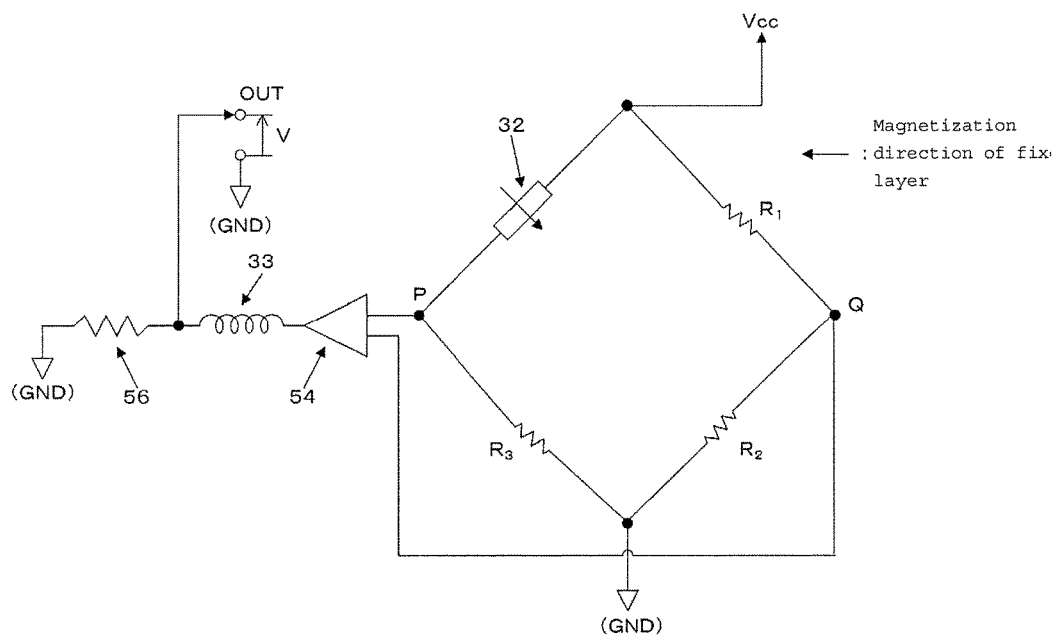
FIG. 23 is a schematic circuit view showing an example of a circuit for still another example of a magnetic sensor element in a magnetic sensor device according to an embodiment of the present disclosure.

FIG. 23 shows an example of another circuit in which the magnetic sensor element 11 embodied on the basis of the concept shown in FIG. 16(*a*) is used. As exemplified in FIG. 23, the magnetoresistance effect element 32 and known resistors R1 to R3 form a bridge circuit. Among the two pairs of terminal groups located on the diagonal lines of the bridge circuit, the terminals included in one pair group are respectively connected to the power source Vcc and the common terminal GND. The terminals included in the other pair are connected to the input terminals of the comparator 54. The output terminal of the comparator 54 is connected through the coil 33 wound around the magnetic body 31 and the fixed resistor 56, to the common terminal GND. The connecting point of the coil 33 and the fixed resistor 56 is connected to the output terminal OUT. The potential of the output terminal OUT from the common terminal GND defines the output potential V of this circuit.

In the circuit of the present example, the output potential of the comparator 54 becomes larger and a larger bias current flows in the coil 33, in proportion to the difference between the ratio of the resistance value of the magnetoresistance effect element 32 relative to the resistance value R1 of the known resistor, and the ratio of the resistance value R2 of the known resistor relative to the resistance value R3 of the known resistor. The potential in proportion to the output potential of the comparator 54 emerges on the output terminal OUT. Namely, the potential V of the output terminal OUT is in proportion to the change of the resistance value of the magnetoresistance effect element 32 (the intensity of the magnetic field to be applied to the magnetoresistance effect element 32). The potential V defines an output signal in proportion to the value of the current to be measured (in the above example, the current flowing through the bus bar).

In this manner, according to the present embodiment, the intensity of the magnetic field applied to the magnetic sensor element can be attenuated. Thereby, the magnetic sensor element 11 can be prevented from being magnetically saturated. As an example, when no magnetic field attenuation body is provided, if a current of 1000 A flows through the bus bar in the example of FIG. 14, a magnetic field having the intensity of about 400 Oe is applied to the magnetic sensor element 11, resulting in the magnetic saturation of the element. Whereas, when a magnetic field attenuation body is provided as in the structure of the present embodiment, the intensity of the magnetic field applied to the magnetic sensor element 11 is attenuated to about ±50 Oe, resulting in preventing the magnetic saturation of the element.

In general, within the range that the magnetic sensor element is not magnetically saturated, the linearity of the output current value relative to the detected magnetic field intensity is comparatively high, and the closer to the area that the magnetic saturation occurs, the lower the linearity. Namely, according to the present embodiment, the magnetic field can be attenuated to the extent that the magnetic saturation of the element can be prevented, and thereby, the range in which the linearity of the output can be maintained, can be expanded. This range includes the case where no magnetic field is present.

The magnetic sensor element 11 according to the present embodiment is embodied on the basis of the concept exemplified in FIG. 16(*a*) and FIG. 16(*b*), and thus, the linearity of the current value relative to the detected magnetic field intensity is improved. Accordingly, the linearity of the output can be maintained in a wider range. This range includes the case where no magnetic field is present.

In the above explanation, the first, second, and third magnetic field attenuation units 12, 13, and 14 are formed using a magnetic material having a high magnetic permeability, such as a lead frame using an alloy such as 45 Alloy, etc. Specifically, a plurality of plate-like magnetic materials are arranged in parallel, and are impregnated with a molten resin, and solidified. In this case, the magnetic field attenuation unit is formed by alternately laminating the plurality of parallel plate-like magnetic materials 301 and the resin 302, as FIG. 24 shows the cross-section in the width direction.

Figure 25:
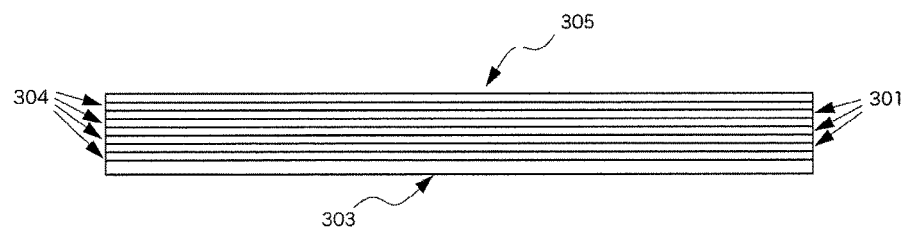
FIG. 25 is an explanatory view showing another formation example of a magnetic field attenuation unit in a magnetic sensor device according to an embodiment of the present disclosure.

The magnetic field attenuation unit may be formed by laminating a plurality of magnetic materials 301 on a base 303 using an adhesion tape 304, and further adhering a PET film 305 by the adhesion tape 304. FIG. 25 shows the cross-section in the width direction of this case.

Figure 26:
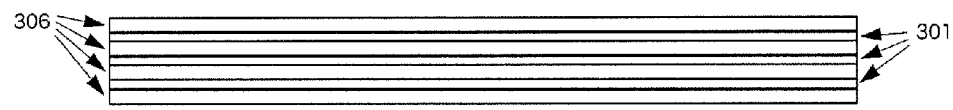
FIG. 26 is an explanatory view showing still another formation example of a magnetic field attenuation unit in a magnetic sensor device according to an embodiment of the present disclosure.

Further, the magnetic field attenuation unit may be formed by alternately laminating a polyimide resin 306 and the magnetic materials 301. In this case, the outermost layer is formed by the polyimide resin 306. FIG. 26 shows the cross-section in the width direction of this case.

Figure 24:
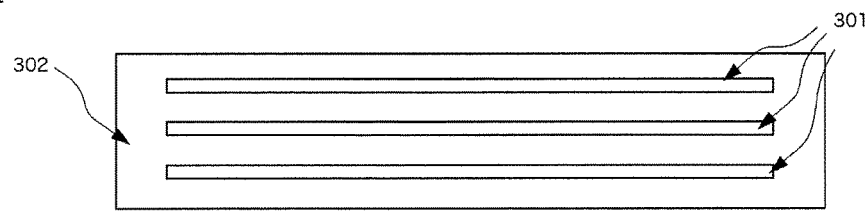
FIG. 24 is an explanatory view showing a formation example of a magnetic field attenuation unit in a magnetic sensor device according to an embodiment of the present disclosure.

In the examples of the magnetic field attenuation unit shown in FIG. 24 to FIG. 26, a plate-like magnetic field attenuation unit is formed. Similarly, a L-shaped or a Π-shaped attenuation unit may be obtained by successively laminating from the inner side while increasing the size.

Figure 27:
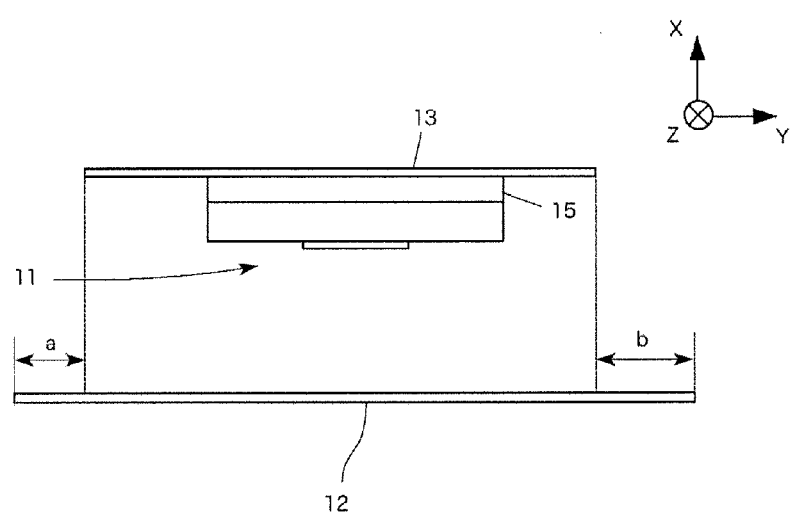
FIG. 27 is an explanatory view showing an example of an attenuation value adjustment method in a magnetic sensor device according to an embodiment of the present disclosure.

In the present embodiment, the shape of the magnetic field attenuation unit may be changed to adjust the attenuation amount of the magnetic field intensity. Specifically, in Example A1, the width (width in the Y-axis direction) of the second magnetic field attenuation unit 13 may be made smaller than the width (width in the Y-axis direction) of the first magnetic field attenuation unit 12. As specifically shown in FIG. 27, the position of the end of the second magnetic field attenuation unit 13 on the negative direction side of the Y-axis is deviated from the position of the end of the first magnetic field attenuation unit 12 on the negative direction side of the Y-axis, by "a" toward the positive side of the Y-axis. Also, the position of the end of the second magnetic field attenuation unit 13 on the positive direction side of the Y-axis is deviated from the position of the end of the first magnetic field attenuation unit 12 on the positive direction side of the Y-axis, by "b" toward the negative side of the Y-axis. Namely, in the example shown in FIG. 27, the width (width in the Y-axis direction) of the second magnetic field attenuation unit 13 is narrower than the width (width in the Y-axis direction) of the first magnetic field attenuation unit 12, by (a+b), with the proviso that a=b may be satisfied or may not be satisfied.

Figure 28:
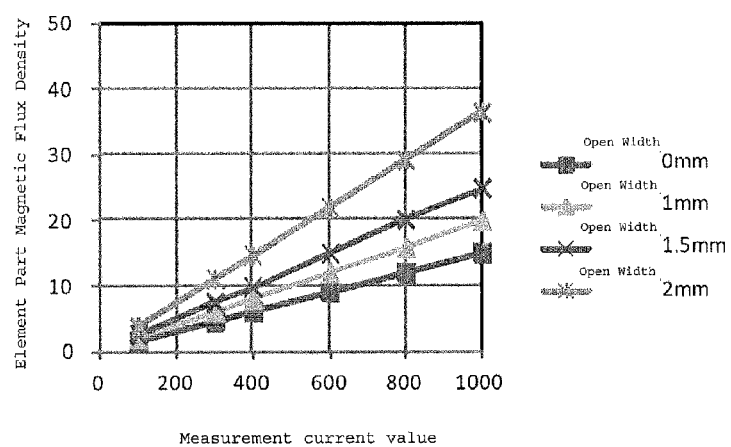
FIG. 28 is an explanatory view showing an example of an attenuation value adjustment in a magnetic sensor device according to an embodiment of the present disclosure.

With respect to Example A1, FIG. 28 shows a relationship between the magnetic flux density near the magnetic sensor element 11 and the current value measured while varying the open width W=a+b. As exemplified in FIG. 28, compared to the case where the open width is 0 mm (the first magnetic field attenuation unit 12 and the second magnetic field attenuation unit 13 have the same width), as the open width is increased to 1 mm, 1.5 mm, 2 mm, . . . , the actual magnetic flux density at the same measurement current value increases exponentially. Namely, by increasing or decreasing the open width, the attenuation amount can be decreased or increased. A desired attenuation amount can be set by adjusting the open width.

Figure 29:
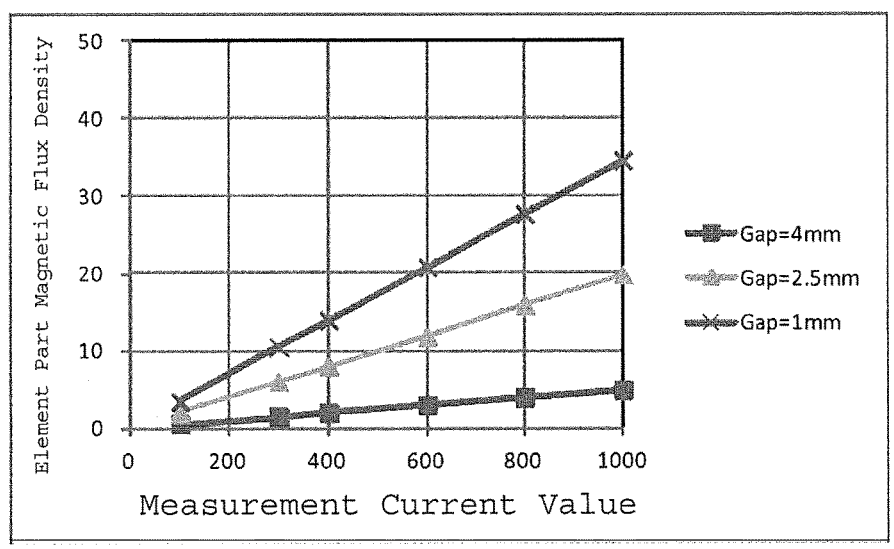
FIG. 29 is an explanatory view showing another example of an attenuation value adjustment in a magnetic sensor device according to an embodiment of the present disclosure.

In addition, the attenuation amount of the magnetic field intensity may be adjusted by changing the distance between the bus bar through which the current to be measured flows and the magnetic sensor device 1 according to the present embodiment. Specifically, as exemplified in FIG. 29, as the distance (gap) between the bus bar and the magnetic sensor device 1 is increased, the actual magnetic flux density at the same measurement current value increases. This increase degree decreases exponentially as the gap increases. Namely, the difference in attenuation amount between the case where the gap is 1 mm and the case where the gap is 2.5 mm is smaller than the difference in attenuation amount between the case where the gap is 2.5 mm and the case where the gap is 4 mm. However, by increasing or decreasing the gap, the attenuation amount may be decreased or increased. Therefore, a desired attenuation amount can be set by adjusting the gap.

Accordingly, in the present embodiment, a desired attenuation amount can be set by adjusting the open width and/or a gap. The above description refers to Example A1, but in Example A2, the width (Y-axis direction width) of the second magnetic field attenuation units 13a and 13b can be respectively controlled to adjust the attenuation amount. Similarly, in Examples B1, B2, B3, and B4, the attenuation amount can be adjusted by controlling the width (Y-axis direction width) of the second magnetic field attenuation unit 13.

As described above, according to an example of the present embodiment, the magnetic sensor element 11 is placed within a resin package and sealed. Here, the resin package may be formed into, for example, a cuboid, and the center thereof may substantially match the center of a cuboid circumscribing the magnetic sensor element 11. Members including the magnetic bodies functioning as magnetic field attenuation units are attached on the surface of the resin package, so as to achieve the spatial arrangement of the above Examples A1, A2, B1, B2, B3, and B4. Specifically, the magnetic field attenuation unit is formed by laminating a plurality of plate-like magnetic bodies (amorphous magnetic body, nanocrystal soft magnetic material, metal band magnetic material, etc.), and integrating with a resin for impregnation.

EXAMPLES

Specifically, with respect to above Examples A1, A2, B1, B2, B3, and B4, magnetic field analyses were performed for a position of the magnetic sensor element, using a magnetic field analysis software JMAG, and the attenuation ratio of the measured magnetic field intensity were simulated. The next table shows a ratio of attenuation amount of the measured magnetic field intensity, the ratio being "1" when no magnetic field attenuation unit is provided, and a ratio of attenuation amount of the external disturbance magnetic field intensity (each of X-, Y-, and Z-axis directions). In these experimental examples, the distance from the bus bar to the element is 5 mm, the distance between the first and second magnetic field attenuation units 12 and 13 is 1 mm, and thickness of each unit is 500 μm. The distance from the bus bar to the first magnetic field attenuation unit 12 is 4 mm.

TABLE 1

| Model | Attenuation Ratio of Measurement Magnetic Field Intensity | Attenuation Ratio of External Disturbance Magnetic Field | | |
|---|---|---|---|---|
| | | X direction | Y direction | Z direction |
| Example A1 | 0.02 | 1.0 | 0.0005 | 0.0005 |
| Example A2 | 0.18 | 1.0 | 0.057 | 0.27 |
| Example B1 | 0.02 | 0.0008 | 0.0003 | 0.0003 |
| Example B2 | 0.02 | 1.0 | 0.0015 | 0.0006 |
| Example B3 | 0.05 | 0.6 | 0.07 | 0.03 |
| Example B4 | 0.38 | 0.8 | 0.35 | 1.0 |

The invention claimed is:
1. A magnetic sensor device comprising:
a magnetic sensor element which is formed on a surface of a substrate and which detects intensity of a magnetic field in a detection axis direction, the detection axis direction being a direction parallel with the surface of the substrate,
first and second surfaces parallel with the detection axis direction,
a first magnetic field attenuation unit which is arranged in the first surface, and which hides the magnetic sensor element in plan view, and
a second magnetic field attenuation unit which is arranged in the second surface, and which is opposed to the first magnetic field attenuation unit with the magnetic sensor element therebetween,
wherein no magnetic attenuation units are arranged in the detection axis direction, and
the first magnetic attenuation unit is arranged between a conductor through which a current to be measured flows, and the magnetic sensor element.

2. A magnetic sensor device comprising:
a magnetic sensor element which is formed on a surface of a substrate and which detects intensity of a magnetic field in a detection axis direction, the detection axis direction being a direction parallel with the surface of the substrate, the magnetic sensor element having a center,
a first magnetic attenuation unit which has a surface parallel with the detection axis direction, and which has a depth and a width capable of hiding the magnetic sensor element in plan view, and
a pair of second magnetic field attenuation units which are opposed to the first magnetic field attenuation unit with the magnetic sensor element therebetween, and which are arranged on opposite sides in a direction perpendicular to the detection axis direction with the center of the magnetic sensor element therebetween in the plan view,
wherein no magnetic attenuation units are arranged in the detection axis direction, and
the first magnetic attenuation unit is arranged between a conductor through which a current to be measured flows, and the magnetic sensor element.

3. A magnetic sensor device set forth in claim 2, wherein the pair of second magnetic field attenuation units are located on an inner side of the first magnetic attenuation unit in the plan view.

4. A magnetic sensor device comprising:
a magnetic sensor element which is formed on a surface of a substrate and which detects intensity of a magnetic field in a detection axis direction, the detection axis direction being a direction parallel with the surface of the substrate, and
a magnetic field attenuation body which includes a first magnetic field attenuation unit, a second magnetic field attenuation unit, and a third magnetic field attenuation unit, each of the first magnetic field attenuation unit and the second magnetic field attenuation unit having a surface and the surfaces being opposed to each other with the magnetic sensor element therebetween, and the third magnetic field attenuation unit being provided in a direction parallel with the detection axis direction of the magnetic sensor element and intersecting the first and second magnetic attenuation units,
wherein, the magnetic sensor device is provided, in the detection axis direction of the magnetic sensor device, with a low magnetic permeability portion which has a magnetic permeability lower than a magnetic permeability of the first and second magnetic field attenuation units, no magnetic attenuation units are arranged in the detection axis direction, and
the first magnetic attenuation unit is arranged between a conductor through which a current to be measured flows, and the magnetic sensor element.

5. A magnetic sensor device set forth in claim 4, wherein the second magnetic field attenuation unit and the third magnetic field attenuation unit are magnetically integrated.

6. A magnetic sensor device set forth in claim 4, wherein a length of the first magnetic field attenuation unit in a direction perpendicular to the detection axis direction of the magnetic sensor element is shorter than a length of the second magnetic field attenuation unit in the direction perpendicular to the detection axis direction of the magnetic sensor element.

7. A magnetic sensor device set forth in claim 4, wherein the first magnetic field attenuation unit and the third magnetic field attenuation unit are magnetically integrated.

8. A magnetic sensor device according to claim 1, further comprising:
an annular magnetic body,
a coil which is wound around the magnetic body, and applies magnetic fields so that directions of the magnetic fields are distributed to spatially rotate 360 degrees over half of a periphery in a peripheral direction, and
a magnetoresistance effect element which is arranged at a center of the annular magnetic body, and comprises a fixed layer having a magnetization direction fixed in a direction of the magnetic field to be measured, and
wherein the detection axis direction of the magnetic sensor element is a direction within a plane of the fixed layer and, and is in parallel or antiparallel with a direction in which the magnetization is fixed.

9. A magnetic sensor device according to claim 2, further comprising:
an annular magnetic body,
a coil which is wound around the magnetic body, and applies magnetic fields so that directions of the magnetic fields are distributed to spatially rotate 360 degrees over half of a periphery in a peripheral direction, and
a magnetoresistance effect element which is arranged at a center of the annular magnetic body, and comprises a fixed layer having a magnetization direction fixed in a direction of the magnetic field to be measured, and
wherein the detection axis direction of the magnetic sensor element is a direction within a plane of the fixed layer and, and is in parallel or antiparallel with a direction in which the magnetization is fixed.

10. A magnetic sensor device according to claim 3, further comprising:
an annular magnetic body,
a coil which is wound around the magnetic body, and applies magnetic fields so that directions of the magnetic fields are distributed to spatially rotate 360 degrees over half of a periphery in a peripheral direction, and
a magnetoresistance effect element which is arranged at a center of the annular magnetic body, and comprises a fixed layer having a magnetization direction fixed in a direction of the magnetic field to be measured, and
wherein the detection axis direction of the magnetic sensor element is a direction within a plane of the fixed layer and, and is in parallel or antiparallel with a direction in which the magnetization is fixed.

11. A magnetic sensor device according to claim 4, further comprising:
- an annular magnetic body,
- a coil which is wound around the magnetic body, and applies magnetic fields so that directions of the magnetic fields are distributed to spatially rotate 360 degrees over half of a periphery in a peripheral direction, and
- a magnetoresistance effect element which is arranged at a center of the annular magnetic body, and comprises a fixed layer having a magnetization direction fixed in a direction of the magnetic field to be measured, and
- wherein the detection axis direction of the magnetic sensor element is a direction within a plane of the fixed layer and, and is in parallel or antiparallel with a direction in which the magnetization is fixed.

12. A magnetic sensor device according to claim 5, further comprising:
- an annular magnetic body,
- a coil which is wound around the magnetic body, and applies magnetic fields so that directions of the magnetic fields are distributed to spatially rotate 360 degrees over half of a periphery in a peripheral direction, and
- a magnetoresistance effect element which is arranged at a center of the annular magnetic body, and comprises a fixed layer having a magnetization direction fixed in a direction of the magnetic field to be measured, and
- wherein the detection axis direction of the magnetic sensor element is a direction within a plane of the fixed layer and, and is in parallel or antiparallel with a direction in which the magnetization is fixed.

13. A magnetic sensor device according to claim 6, further comprising:
- an annular magnetic body,
- a coil which is wound around the magnetic body, and applies magnetic fields so that directions of the magnetic fields are distributed to spatially rotate 360 degrees over half of a periphery in a peripheral direction, and
- a magnetoresistance effect element which is arranged at a center of the annular magnetic body, and comprises a fixed layer having a magnetization direction fixed in a direction of the magnetic field to be measured, and
- wherein the detection axis direction of the magnetic sensor element is a direction within a plane of the fixed layer and, and is in parallel or antiparallel with a direction in which the magnetization is fixed.

14. A magnetic sensor device according to claim 7, further comprising:
- an annular magnetic body,
- a coil which is wound around the magnetic body, and applies magnetic fields so that directions of the magnetic fields are distributed to spatially rotate 360 degrees over half of a periphery in a peripheral direction, and
- a magnetoresistance effect element which is arranged at a center of the annular magnetic body, and comprises a fixed layer having a magnetization direction fixed in a direction of the magnetic field to be measured, and
- wherein the detection axis direction of the magnetic sensor element is a direction within a plane of the fixed layer and, and is in parallel or antiparallel with a direction in which the magnetization is fixed.

15. A magnetic sensor device according to claim 2, further comprising:
- an annular magnetic body,
- a coil which is wound around the magnetic body, and applies magnetic fields so that directions of the magnetic fields are distributed to spatially rotate 360 degrees over half of a periphery in a peripheral direction, and
- a magnetoresistance effect element which is arranged at a center of the annular magnetic body, and comprises a fixed layer having a magnetization direction fixed in a direction of the magnetic field to be measured, and
- wherein the detection axis direction of the magnetic sensor element is a direction within a plane of the fixed layer and, and is in parallel or antiparallel with a direction in which the magnetization is fixed.

16. A magnetic sensor device according to claim 4, further comprising:
- an annular magnetic body,
- a coil which is wound around the magnetic body, and applies magnetic fields so that directions of the magnetic fields are distributed to spatially rotate 360 degrees over half of a periphery in a peripheral direction, and
- a magnetoresistance effect element which is arranged at a center of the annular magnetic body, and comprises a fixed layer having a magnetization direction fixed in a direction of the magnetic field to be measured, and
- wherein the detection axis direction of the magnetic sensor element is a direction within a plane of the fixed layer and, and is in parallel or antiparallel with a direction in which the magnetization is fixed.

17. A magnetic sensor device according to claim 1, further comprising:
- an annular magnetic body,
- a coil which is wound around the magnetic body, and applies magnetic fields so that directions of the magnetic fields are distributed to spatially rotate 360 degrees over half of a periphery in a peripheral direction, and
- a magnetoresistance effect element which is arranged at a center of the annular magnetic body, and comprises a fixed layer having a magnetization direction fixed in a direction of the magnetic field to be measured, and
- wherein the detection axis direction of the magnetic sensor element is a direction within a plane of the fixed layer, and is in parallel or antiparallel with a direction in which the magnetization is fixed.

* * * * *